United States Patent
Lian et al.

(10) Patent No.: US 11,877,426 B2
(45) Date of Patent: Jan. 16, 2024

(54) TEMPERATURE CONTROL CABINET AND COMMUNICATIONS SYSTEM

(71) Applicant: Huawei Digital Power Technologies Co., Ltd., Shenzhen (CN)

(72) Inventors: Zhisheng Lian, Dongguan (CN); Yongqi Qiu, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 107 days.

(21) Appl. No.: 17/576,399

(22) Filed: Jan. 14, 2022

(65) Prior Publication Data

US 2022/0232740 A1     Jul. 21, 2022

(30) Foreign Application Priority Data

Jan. 15, 2021 (CN) .......................... 202120117973.9

(51) Int. Cl.
*H05K 5/02* (2006.01)
*H05K 7/20* (2006.01)
*H05K 5/03* (2006.01)

(52) U.S. Cl.
CPC ....... *H05K 7/20572* (2013.01); *H05K 5/0213* (2013.01); *H05K 5/03* (2013.01); *H05K 7/20145* (2013.01); *H05K 7/20172* (2013.01)

(58) Field of Classification Search
CPC ........... H05K 7/20572; H05K 7/20145; H05K 7/20172; H05K 5/0213; H05K 5/03
See application file for complete search history.

(56) References Cited

U.S. PATENT DOCUMENTS

| | | | |
|---|---|---|---|
| 10,631,441 B2* | 4/2020 | Van Den Bergen | G03F 7/70991 |
| 10,741,960 B2* | 8/2020 | Richardson | H02G 3/16 |
| 2012/0160448 A1 | 6/2012 | Chen et al. | |
| 2020/0390002 A1* | 12/2020 | Da Silva Weber | H05K 7/20145 |
| 2020/0390009 A1* | 12/2020 | Whitehead | G02F 1/133385 |
| 2021/0099044 A1* | 4/2021 | Campos | H05K 5/0213 |
| 2021/0315128 A1* | 10/2021 | Lian | H05K 7/202 |
| 2022/0330442 A1* | 10/2022 | Wu | H05K 5/0213 |

(Continued)

FOREIGN PATENT DOCUMENTS

| CN | 102124295 A | 7/2011 |
|---|---|---|
| CN | 203661433 U | 6/2014 |

(Continued)

*Primary Examiner* — Adrian S Wilson
(74) *Attorney, Agent, or Firm* — Leydig, Voit & Mayer, Ltd.

(57) ABSTRACT

A temperature control cabinet includes at least one cabinet unit. Each cabinet unit includes: a subrack, where there is a placement space for placing a device inside the subrack, and there is at least one opening at a periphery of the cabinet; and a cabinet door mounted on the subrack and configured to buckle the opening, where at least two temperature control components are disposed on the cabinet door, the temperature control components are arranged in a first direction, the first direction is a direction from the top to the bottom of the subrack, each temperature control component is provided with an air exhaust vent and an air return vent, the air return vent of each temperature control component communicates with a hot area at the top of the placement space, and the air exhaust vent of each temperature control component communicates with the placement space.

20 Claims, 37 Drawing Sheets

(56) References Cited

U.S. PATENT DOCUMENTS

| | | | | |
|---|---|---|---|---|
| 2023/0057893 A1* | 2/2023 | Lian | ................. | H05K 5/0214 |
| 2023/0095593 A1* | 3/2023 | Meng | ................. | H01M 50/251 |
| | | | | 361/691 |
| 2023/0167991 A1* | 6/2023 | Lian | ................. | F24F 7/08 |
| | | | | 454/184 |

FOREIGN PATENT DOCUMENTS

| | | |
|---|---|---|
| CN | 205071572 U | 3/2016 |
| CN | 207201176 U | 4/2018 |
| CN | 207252130 U | 4/2018 |
| CN | 110799018 A | 2/2020 |
| CN | 111787759 A | 10/2020 |

\* cited by examiner

TEMPERATURE CONTROL CABINET AND COMMUNICATIONS SYSTEM

CROSS-REFERENCE TO RELATED APPLICATION

This application claims priority to Chinese Patent Application No. 202120117973.9 filed on Jan. 15, 2021, which is hereby incorporated by reference in its entirety.

TECHNICAL FIELD

This application relates to the field of communications device technologies, in particular, to a temperature control cabinet and a communications system.

BACKGROUND

With emergence of problems, such as a rapid increase in demand for edge computing, increasingly high rents of indoor computer rooms, and sinking of aggregation/access/convergence sites, changing an indoor site into an outdoor site gradually becomes a trend of the market. Because an outdoor cabinet accommodates more devices, a greater cooling capacity needs to be provided, and temperature control in the cabinet needs to be more accurate, a temperature control cabinet with a one-cabinet multi-temperature function emerges as the times require.

Two temperature control components that are arranged vertically are usually mounted on a door plate of an existing temperature control cabinet. Cold air out of an upper temperature control component is drawn away by return air of the lower temperature control component, which results in an air duct short circuit phenomenon. This phenomenon results in that a return air temperature of the lower temperature control component is reduced, and a temperature control effect cannot be fully exerted. Accordingly, a temperature control capability of the entire cabinet is affected.

Therefore, how to improve the temperature control capability of the cabinet temperature control is an urgent problem to be resolved.

SUMMARY

This application provides a temperature control cabinet and a communications system, to improve a temperature control capability of the temperature control cabinet.

According to a first aspect, this application provides a temperature control cabinet. The temperature control cabinet includes at least one cabinet unit, and each cabinet unit includes a subrack. Specifically, the subrack is a frame-type structure and has at least one opening at the periphery of the cabinet, and there is a placement space for placing a device inside the cabinet. In an exemplary arrangement, a cabinet door may be selected to buckle the opening of the cabinet. For example, only the front side of the cabinet may be provided with an opening, or both the front side and the rear side of the cabinet may be provided with openings. When the front side of the cabinet is provided with an opening, a cabinet door buckling the opening is used as a front door. When both the front side and the rear side of the cabinet are provided with openings, a cabinet door buckling the opening on the front side of the cabinet is used as a front door, and a cabinet door buckling the opening on the rear side of the cabinet is used as a rear door. Side plates may be disposed on the left and right sides of the cabinet. It should be understood that the "front side", "rear side", "left side", and "right side" are defined based on a state when the temperature control cabinet is used, an arrangement direction of the front side and rear side of the cabinet forms a depth direction, and the device is usually inserted into the placement space in the depth direction from the front door or rear door. At least two temperature control components are disposed on each cabinet door, and the at least two temperature control components are arranged in a first direction. It should be noted that the first direction is a direction from the top to the bottom of the subrack.

Heat generated during operation of the device causes air in the vicinity of the device to warm up and become high-temperature air, and the air rises to the top of the placement space, to form a hot area at the top of the placement space. In addition, an air return vent of each temperature control component in the temperature control cabinet provided in this application is communicated with the hot area at the top of the placement space, so that air entering the air return vent during operation of each temperature control component is the high-temperature air from the hot area at the top of the placement space. This can eliminate an air duct short circuit influence between a plurality of temperature control components, and enable the temperature control components to work in a same return air temperature range, which facilitates prolonging useful lives of the temperature control components, enables return air temperatures of the temperature control components to be more uniform, and can ensure that the temperature control components can operate with high efficiency. Accordingly, a temperature control capability of the temperature control cabinet can be improved.

When the temperature control cabinet provided in this application is disposed, that the temperature control cabinet is provided with one cabinet unit is used as an example for description. An air duct mechanical part may be disposed inside the subrack of each cabinet unit, and an air duct group disposed on the air duct mechanical part is used to connect a return air vent and an air exhaust vent of each temperature control component. For example, the air duct groups may be disposed to be in one-to-one correspondence with the temperature control components, and each air duct group is connected to one temperature control component. Specifically, each air duct group is provided with at least one hot air duct and at least one cold air duct. A hot air intake vent of each hot air duct is located in the hot area, and a hot air exhaust vent of each hot air duct is connected to a return air vent of a temperature control component to deliver high-temperature return air to the temperature control component. A cold air intake vent of each cold air duct is communicated with an air exhaust vent of the temperature control component, and a cold air exhaust vent of each cold air duct is located in the placement space in the subrack to deliver low-temperature air output from the air exhaust vent of the temperature control component to the space where the device is located, to cool the device in the placement space. It should be noted that a detachably connected window may be disposed on the hot air duct for later maintenance of the temperature control component.

That a first temperature control component and a second temperature control component are disposed on the cabinet door is used as an example for description. The second temperature control component is disposed on a side of the first temperature control component close to a bottom of the subrack, and an air return vent of the first temperature control component, an air exhaust vent of the first temperature control component, an air return vent of the second temperature control component, and an air exhaust vent of the second temperature control component are arranged in sequence in the first direction. The air duct mechanical part includes a first air duct mechanical part and a second air duct mechanical part. The first air duct mechanical part is provided with a first air duct group corresponding to the first temperature control component, and the second air duct mechanical part is provided with a second air duct group corresponding to the second temperature control component. In other words, the air duct groups corresponding to the first temperature control component and the second temperature control component are respectively formed on the first air duct mechanical part and the second air duct mechanical part. In an exemplary arrangement, the first air duct mechanical part and the second air duct mechanical part may have integrated structures to facilitate manufacturing; or the first air duct mechanical part and the second air duct mechanical part may have split structures, and the air duct mechanical parts may be mounted together with corresponding temperature control components, to facilitate mounting and maintenance operations.

When the first air duct mechanical part and the second air duct mechanical part are disposed, the first air duct mechanical part and the second air duct mechanical part may be disposed in a plurality of manners, specifically, in at least one of the following implementations. It should be noted that the temperature control cabinet provided in this application further includes a second direction and a third direction. The second direction is perpendicular to the first direction and is parallel to an extension direction of the cabinet door. The third direction is the depth direction of the cabinet, and the third direction is perpendicular to the first direction and the second direction.

In an exemplary implementation, a hot air duct of the second air duct mechanical part is located on both sides of the first temperature control component in the second direction. In this implementation, the hot air duct of the second air duct mechanical part is disposed on both sides of the first temperature control component. After each device is mounted, a first temperature control device is embedded into a space formed by the hot air duct of the second air duct mechanical part, to reduce space occupied by the second air duct mechanical part and the first air duct mechanical part in the cabinet in the depth direction.

An air exhaust direction of a cold air exhaust vent of the first air duct mechanical part has a first included angle with the second direction, and an angle range of the first included angle is greater than or equal to 0° and less than 90°; and an air exhaust direction of a cold air exhaust vent of the second air duct mechanical part has a second included angle with the second direction, and an angle range of the second included angle is greater than or equal to 0° and less than 90°. An advantage of this implementation is that exhausted air of both the air duct mechanical part and the second air duct mechanical part are led to the side plates of the cabinet, to prevent the device in the placement space from being directly blown. This can prevent condensation on a device in a specific scenario.

In an exemplary implementation, a hot air duct of the second air duct mechanical part is located on both sides of the first temperature control component in the second direction. In this implementation, the hot air duct of the second air duct mechanical part is disposed on both sides of the first temperature control component. After each device is mounted, a first temperature control device is embedded into a space formed by the hot air duct of the second air duct mechanical part, to reduce space occupied by the second air duct mechanical part and the first air duct mechanical part in the cabinet in the depth direction. In addition, the second air duct structure is further provided with at least one auxiliary air duct. Each auxiliary air duct is provided with an auxiliary intake vent and an auxiliary exhaust vent. The auxiliary intake vent is located at the bottom of the placement space, and the auxiliary exhaust vent is communicated with the air return vent of the second temperature control component. The auxiliary air duct can avoid a problem that an air path for the second temperature control component to return air only from the hot area at the top of the placement space is long, and a working point of an air conditioning fan is affected.

An air exhaust direction of a cold air exhaust vent of the first air duct mechanical part has a first included angle with the second direction, and an angle range of the first included angle is greater than or equal to 0° and less than 90°; and an air exhaust direction of a cold air exhaust vent of the second air duct mechanical part has a second included angle with the second direction, and an angle range of the second included angle is greater than or equal to 0° and less than 90°. In this implementation, exhausted air of both the first air duct mechanical part and the second air duct mechanical part are led to the side plates of the cabinet, to prevent the device in the placement space from being directly blown. Accordingly, condensation on a device in a specific scenario can be prevented. It should be noted that, in this implementation, the first included angle and the second included angle may be set according to a requirement, and details are not described herein.

In an exemplary implementation, a hot air intake vent of the first air duct mechanical part and a hot air intake vent of the second air duct mechanical part are arranged in the third direction, and the hot air intake vent of the first air duct mechanical part is located on a side of the hot air intake vent of the second air duct mechanical part facing the cabinet door. It should be understood that, in this embodiment, a hot air duct corresponding to the second temperature control component and a hot air duct corresponding to the first temperature control component are arranged in the depth direction of the cabinet. An overall structure design is simple, and is applicable to a scenario in which a temperature control component is wide in width and space cannot be expanded along a second side.

An air exhaust direction of a cold air exhaust vent of the first air duct mechanical part has a first included angle with the second direction, and the first included angle is 0°; and an air exhaust direction of a cold air exhaust vent of the second air duct mechanical part has a second included angle with the second direction, and the second included angle is 0°. In this implementation, exhausted air of both the air duct mechanical part and the second air duct mechanical part are led to the side plates of the cabinet, to prevent the device in the placement space from being directly blown. This can prevent condensation on a device in a specific scenario.

In an exemplary implementation, a hot air intake vent of the first air duct mechanical part and a hot air intake vent of the second air duct mechanical part are arranged in the second direction; and the second air duct mechanical part is provided with two hot air intake vents, and the hot air intake vent of the first air duct is located between the two hot air intake vents of the second air duct mechanical part in the second direction. An air exhaust direction of a cold air exhaust vent of the first air duct mechanical part has a first included angle with the second direction, and the first included angle is 90°; and an air exhaust direction of a cold air exhaust vent of the second air duct mechanical part has a second included angle with the second direction, and the second included angle is 90°. In this implementation, designs of the first air duct mechanical part and the second air duct mechanical part are relatively simple, and a cold air exhaust vent corresponding to the first temperature control component and a cold air exhaust vent corresponding to the second temperature control component can directly blow the device, to enhance a temperature control capability of a system.

To improve heat dissipation efficiency of the temperature control cabinet provided in this application, a cover plate may be disposed in the cabinet of each cabinet unit, to better deliver hot air generated by the device in the placement space to the hot area. Specifically, the placement space includes a device placement area for placing the device and the hot area at the top of the device placement area. The cover plate is disposed on a side of the air duct mechanical part away from the bottom of the subrack and on a side of the air duct mechanical part away from the temperature control mechanical parts. The cover plate has an opening for leading hot air in the device placement area to the hot area, so that more hot air can enter the temperature control devices from the hot area, to improve heat dissipation efficiency of the entire system.

It should be understood that the temperature control cabinet provided in this application may also be applied to a freezer application scenario. Specifically, the temperature control cabinet may include a plurality of cabinet units, and adjacent temperature control cabinets share a side plate. To implement communication between cabinets between adjacent cabinet units and implement inter-cabinet cooling capacity sharing, a hole may be provided on the side plate shared by the adjacent cabinet units. Certainly, to accelerate cooling capacity circulation between the adjacent cabinet units, an auxiliary circulating device may be mounted at the hole to accelerate air flowing between the adjacent cabinet units. For example, the auxiliary circulating device may be a fan.

According to a second aspect, this application further provides a communications system, including any temperature control subrack and the device provided in the foregoing technical solution. The device is selectively placed in the temperature control cabinet. When the communications system provided in this application is used, the air return vent of each temperature control component in the temperature control cabinet is communicated with the hot area at the top of the placement space, so that air entering the air return vent during operation of each temperature control component is the high-temperature air from the hot area at the top of the placement space. This can eliminate an air duct short circuit influence between a plurality of temperature control components, and enable the temperature control components to work in a same return air temperature range, which facilitates prolonging useful lives of the temperature control components, enables return air temperatures of the temperature control components to be more uniform, can ensure that the temperature control components can operate with high efficiency, and can improve temperature control capability of the temperature control cabinet. Accordingly, operation stability of the communications system can be improved.

DETAILED DESCRIPTION

Figure 1:
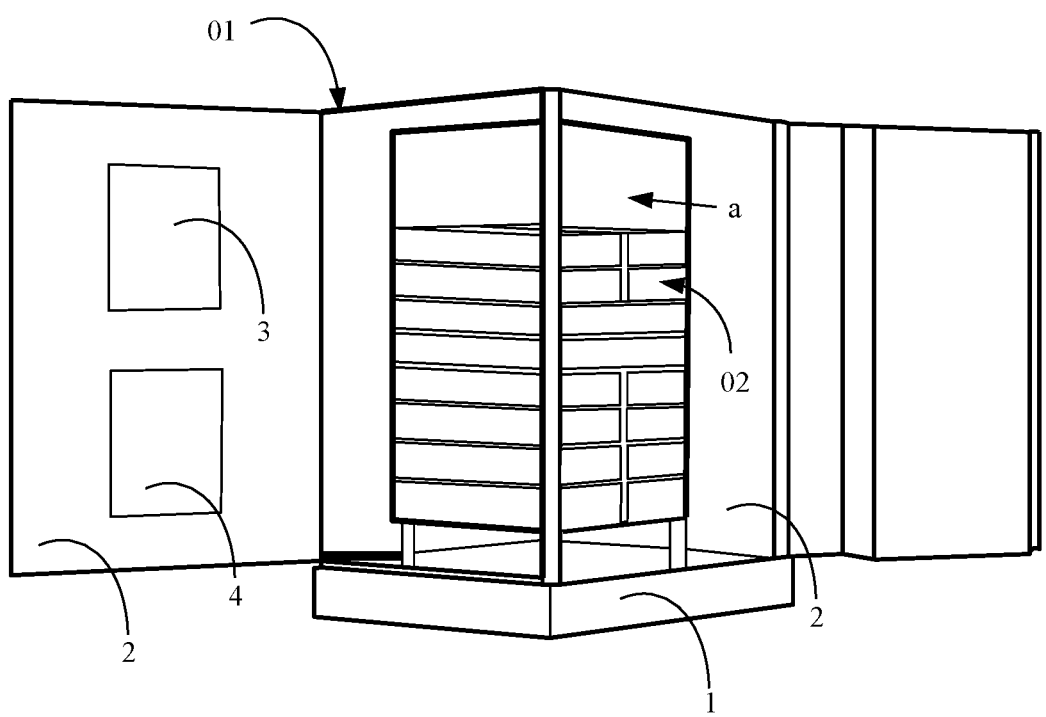
FIG. 1 is a possible application scenario of a temperature control cabinet in the conventional technology.

A temperature control cabinet provided in the embodiments of this application may be applied to a common communications system 001. A possible application scenario of the temperature control cabinet 01 in the current communications system 001 is shown in FIG. 1. A device 02 is placed in the temperature control cabinet 01. A cabinet door 2 is mounted on each of two opposite sides of a subrack 1 of the temperature control cabinet 01, and a first temperature control component 3 and a second temperature control component 4 are mounted on each cabinet door 2. The first temperature control component 3 and the second temperature control component 4 are configured to cool the device 02 in the subrack 1.

Figure 2:
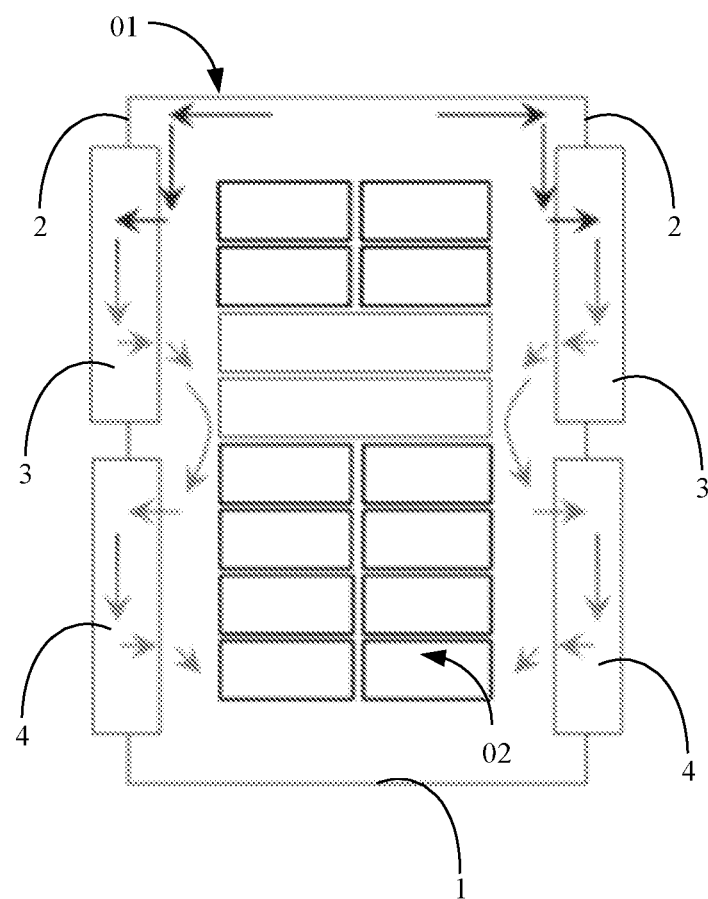
FIG. 2 is a diagram of an air flowing direction in the temperature control cabinet shown in FIG. 1.

FIG. 2 is a diagram of an air flowing direction in the temperature control cabinet 01 shown in FIG. 1. Specifically, FIG. 2 is a diagram of a structure of the temperature control cabinet 01 in FIG. 1 viewed along a side surface (namely, a direction a) of the subrack 1 after the cabinet doors 2 are buckled. Air in the temperature control cabinet 01 flows in arrow directions in FIG. 2. It should be noted that, in the structure shown in FIG. 2, cold air output from the first temperature control component 3 on the cabinet door 2 of each side after cooling enters a return air vent of the second temperature control component 4 to cause an air duct short circuit phenomenon, which reduces a return air temperature of the second temperature control component 4. A temperature control effect of the second temperature control component 4 cannot be fully exerted due to the air duct short circuit phenomenon. Accordingly, a temperature control capability of the entire system is affected. When the device 02 placed in an area corresponding to the second temperature control component 4 is a battery or a passive device and the device 02 placed in an area corresponding to the first temperature control component 3 is a high heat consumption device, an upper and lower temperature gradient in the subrack 1 are significantly large, and the air duct short circuit phenomenon may even result in a phenomenon that the first temperature control component 3 stops working and breaks down due to high heat consumption while the second temperature control component 4 is not fully operated.

Figure 3:
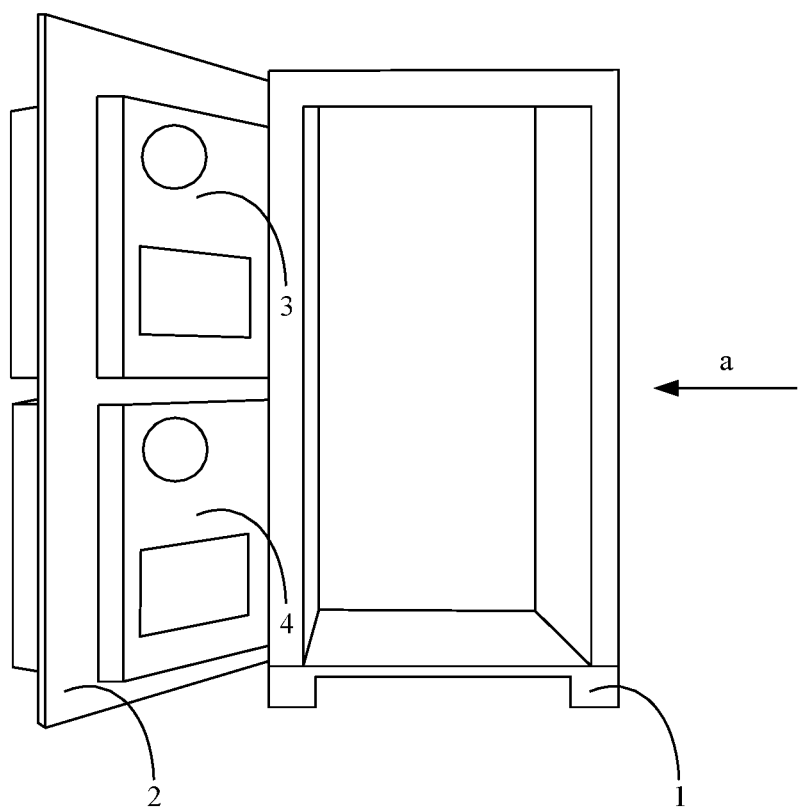
FIG. 3 is another possible application scenario of a temperature control cabinet in the conventional technology.

The temperature control cabinet 01 in FIG. 1 may also be implemented through another structure shown in FIG. 3. Compared with the structure shown in FIG. 1, in the temperature control cabinet 01 shown in FIG. 3, a cabinet door 2 is mounted on only one side of a subrack 1.

Figure 4:
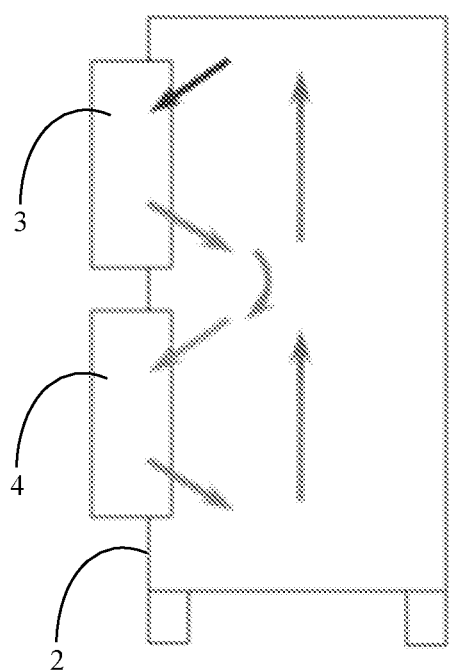
FIG. 4 is a diagram of an air flowing direction in the temperature control cabinet shown in FIG. 3.

FIG. 4 is a diagram of an air flowing direction in the temperature control cabinet 01 shown in FIG. 3. Specifically, FIG. 4 is a diagram of a structure of the temperature control cabinet 01 in FIG. 3 viewed along a side surface (namely, a direction a) of the subrack 1 after the cabinet door 2 is buckled. Air in the temperature control cabinet 01 flows in an arrow direction in FIG. 4. It should be noted that, in the structure shown in FIG. 4, cold air output from a first temperature control component 3 disposed on the cabinet door 2 after cooling enters a return air vent of a second temperature control component 4. In this application scenario, the temperature control cabinet 01 also has an air duct short circuit phenomenon, a temperature control effect of the second temperature control component 4 cannot be fully exerted, and the temperature control capability of the entire system is affected.

It can be learned from the above analysis that the temperature control cabinet 01 in the current communications system 001 has the air duct short circuit phenomenon during application. This phenomenon results in that a return air temperature of the second temperature control component 4 is reduced, and the temperature control effect cannot be fully exerted. Accordingly, the temperature control capability of the entire cabinet is affected.

In view of this, this application provides a temperature control cabinet and a communications system, to improve a temperature control capability of the temperature control cabinet.

Terms used in the following embodiments of this application are merely intended to describe exemplary embodiments, but are not intended to limit this application. The terms "one", "a" and "this" of singular forms used in this specification and the appended claims of this application are also intended to include expressions such as "one or more", unless otherwise specified in the context clearly.

Reference to "one embodiment" or "some embodiments" described in this specification or the like means that one or more embodiments of this application include a particular feature, structure, or characteristic described in combination with the embodiment. Thus, phrases "in one embodiment", "in some embodiments", "in some other embodiments", "in some additional embodiments", and the like that appear in different parts in this specification do not necessarily mean referring to a same embodiment, but mean "one or more embodiments, but not all embodiments", unless otherwise specifically emphasized. The terms "include", "comprise", "have", and their variants all mean "include but are not limited to", unless otherwise specifically emphasized.

The following clearly describes the technical solutions in embodiments of this application with reference to the accompanying drawings in the embodiments of this application.

Embodiment 1

Figure 5:
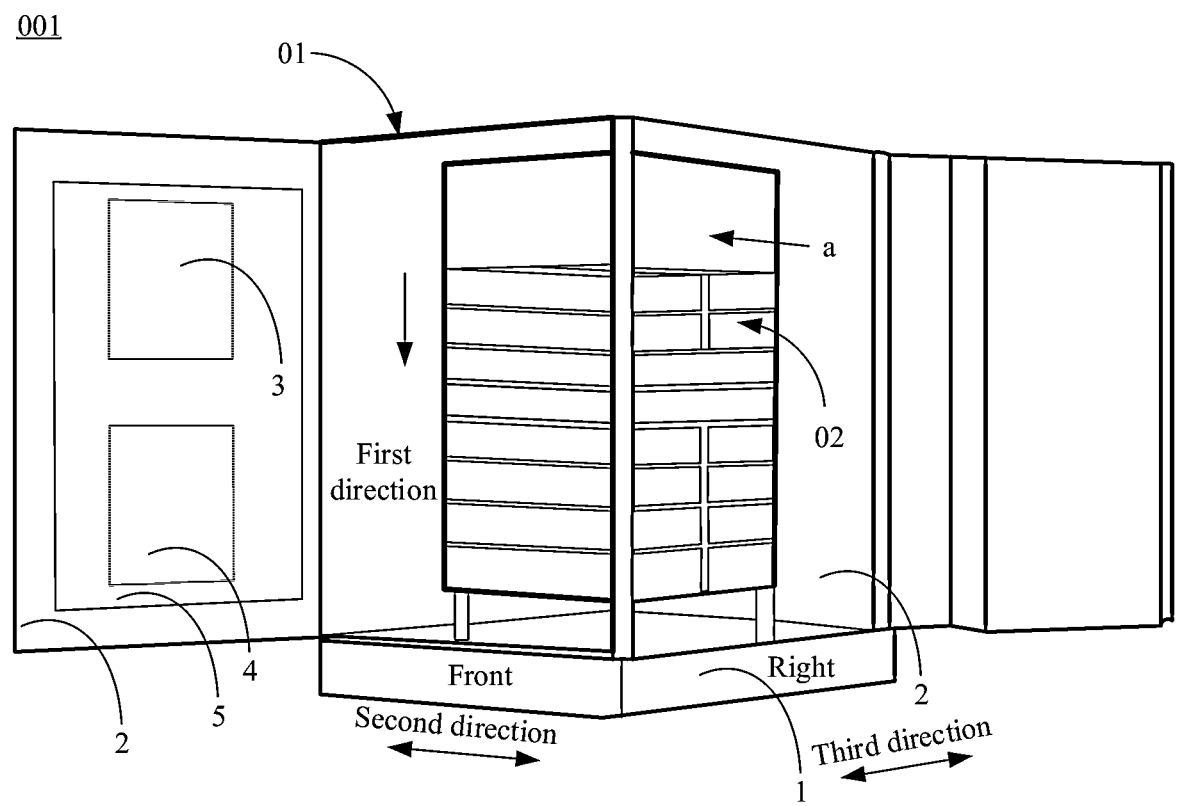
FIG. 5 is a schematic diagram of a usage state of a temperature control cabinet in a communications system after a device is mounted in the temperature control cabinet according to Embodiment 1 of this application.

FIG. 5 is a schematic diagram of a usage state of a temperature control cabinet 01 in a communications system 001 after a device 02 is mounted in the temperature control cabinet according to Embodiment 1 of this application. To describe a structure of a temperature control component provided in this embodiment of this application more clearly, "front", "rear", "left", and "right" are defined based on the usage state of the temperature control cabinet 01. Details are shown in FIG. 5. It should be understood that due to a placement angle problem of a temperature control component 01, "front" and "right" are marked in FIG. 5, a side opposite to "front" in the temperature control cabinet 01 is "rear", and a side opposite to "right" is "left".

In the structure shown in FIG. 5, in this application scenario, the temperature control cabinet 01 provided in this embodiment of this application includes only one cabinet unit, and the cabinet unit includes two cabinet doors 2 for buckling openings of a subrack 1. Based on the usage state of the temperature control cabinet 01, generally, one of the two cabinet doors 2 is located on the front side of the subrack 1 as a front side cabinet door, and the other is located on the rear side of the subrack 1 as a rear side cabinet door. Specifically, a first temperature control component 3 and a second temperature control component 4 that are arranged in a direction from the top to the bottom of the subrack 1 are disposed on each of the two cabinet doors 2. It should be understood that a quantity of temperature control components on each cabinet door 2 is not limited to two, and may be another quantity. The quantity of temperature control components may be set according to a use requirement. Details are not described herein. Each of the first temperature control component 3 and the second temperature control component 4 includes but is not limited to an air conditioner, a heat exchanger, a direct ventilation module, a semiconductor cooler (thermo electric cooler (TEC)) module, or the like.

It should be noted that, in the structure shown in FIG. 5, the device 02 can be placed in and taken out of the temperature control cabinet 01 provided in this embodiment of this application through the cabinet doors 2, and the first temperature control component 3 and the second temperature control component 4 are configured to cool the internal space of the temperature control cabinet 01 to ensure normal operation of the device 02. An air duct mechanical part 5 configured to perform air guidance on the first temperature control component 3 and the second temperature control component 4 is disposed on the cabinet door 2 on each side. The air duct mechanical part 5 can improve a temperature control capability of the temperature control cabinet 01 provided in this embodiment of this application.

Certainly, the temperature control cabinet 01 provided in this embodiment of this application may alternatively include only one cabinet door 2. For example, the cabinet door 2 may be the front side cabinet door on the front side of the subrack 1. A quantity of cabinet doors 2 may be set according to a requirement, and details are not described herein.

Continue to refer to the structure shown in FIG. 5. To facilitate description of components in the temperature control cabinet 01 provided in this embodiment of this application, it may be specified that the direction from the top to the bottom of the subrack 1 is a first direction, a direction perpendicular to the first direction and parallel to an extension direction of the cabinet door 2 is a second direction, and a direction perpendicular to a plane where the first direction and the second direction are located is a third direction. It should be noted that the third direction is a depth direction of the subrack 1.

Figure 6:
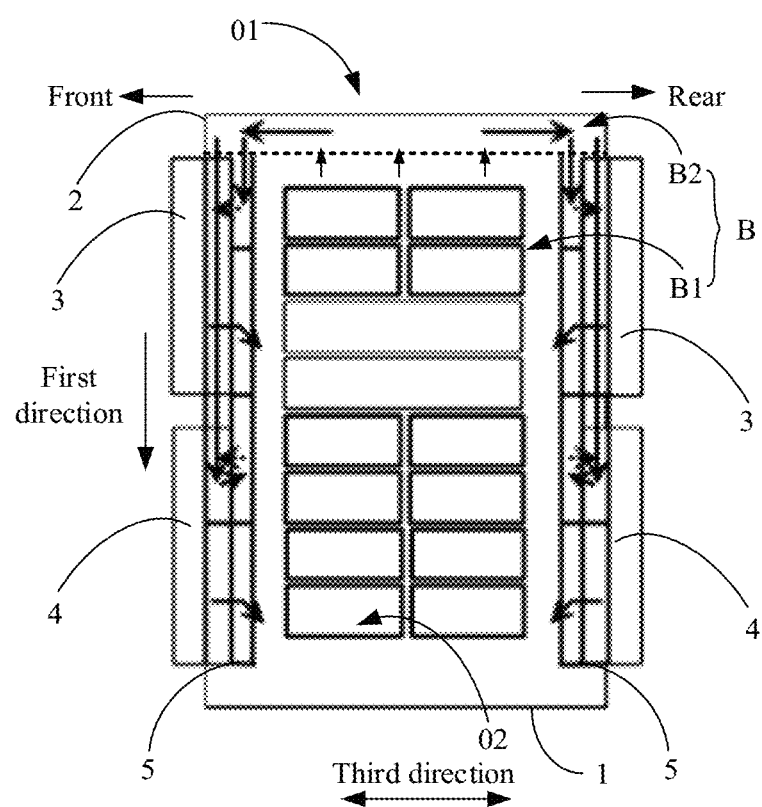
FIG. 6 is a diagram of a structure of the temperature control cabinet and the device viewed in a direction a in FIG. 5.

FIG. 6 is a diagram of a structure of the temperature control cabinet 01 and the device 02 viewed in a direction a in FIG. 5. The direction a is parallel to the second direction. Since the temperature control components on the two cabinet doors 2 in FIG. 6 are disposed in a similar manner, the cabinet door 2 on the front side as well as the first temperature control component 3 and the second temperature control component 4 that are disposed on the cabinet door 2 are used as an example for description. In the structure shown in FIG. 6, there is a placement space B inside the subrack 1. The placement space B includes a device placement area B1 for placing the device 02 and a hot area B2 at the top of the device placement area B1. Heat generated during operation of the device 02 causes air in the vicinity of the device 02 to warm up and become high-temperature air, and the high-temperature air rises from the device placement area B1 to the hot area B2. The air duct mechanical part 5 may separately deliver the high-temperature air in the hot area B2 to the first temperature control component 3 and the second temperature control component 4 in an arrow direction. To mark the device placement area B1 and the hot area B2 more clearly, dashed lines are used for schematic separation in FIG. 6. It should be understood that a distribution of the device placement area B1 and the hot area B2 is not limited to the structure in FIG. 6. Since the hot area B2 in the subrack 1 is usually located at the top of the placement space B and occupies about one-third of the placement space B, the device placement area B1 may be roughly considered as a cold area.

Certainly, distribution proportions of the cold area and the hot area B2 in the cabinet 1 may be changed according to a use requirement, for example, the hot area B2 accounts for one half or one fifth of the placement space B. Details are not described herein.

Figure 7:
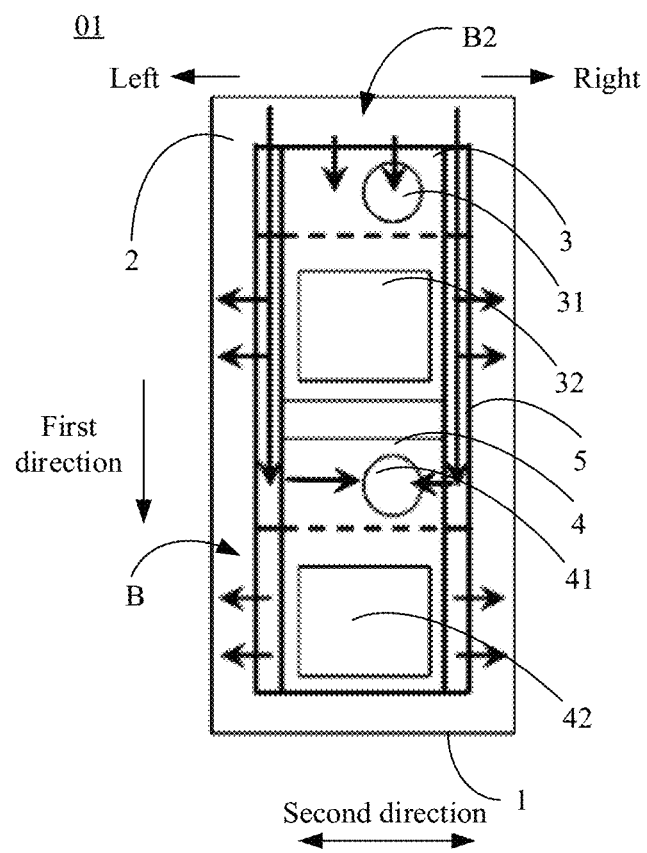
FIG. 7 is another diagram of a structure of the temperature control cabinet in FIG. 5 viewed in a third direction.

FIG. 7 is a diagram of a structure of the temperature control cabinet 01 in FIG. 5 viewed in the third direction. Refer to a structure shown in FIG. 7 with reference to FIG. 6. The first temperature control component 3 and the second temperature control component 4 are arranged in the first direction, and an air return vent 31 of the first temperature control component 3, an air exhaust vent 32 of the first temperature control component 3, an air return vent 41 of the second temperature control component 4, and an air exhaust vent 42 of the second temperature control component 4 are also arranged in sequence in the first direction. Certainly, the air return vent 31 of the first temperature control component 3, the air exhaust vent 32 of the first temperature control component 3, the air return vent 41 of the second temperature control component 4, and the air exhaust vent of the second temperature control component 4 are not limited to the structure shown in FIG. 7, and may be modified according to a requirement. The structure herein is only an example.

Continue to refer to the structure shown in FIG. 7. The air duct mechanical part 5 delivers the high-temperature air at the top of the placement space B to the return air vent 31 of the first temperature control component 3, and the first temperature control component 3 cools the air to form low-temperature air. The low-temperature air is output through the air exhaust vent 32 of the first temperature control component 3 and is delivered to the placement space B through the air duct mechanical part 5 to cool the device. In addition, the air duct mechanical part 5 delivers the high-temperature air at the top of the placement space B to the return air vent 41 of the second temperature control component 4, and the second temperature control component 4 cools the air to form low-temperature air. The low-temperature air is output through the air exhaust vent 42 of the second temperature control component 4 and is delivered to the placement space B through the air duct mechanical part 5 to cool the device.

It should be noted that the temperature control cabinet 01 provided in this embodiment of this application uses the air duct mechanical part 5, and an air duct group in the air duct mechanical part 5 is separately connected to the first temperature control component 3 and the second temperature control component 4, so that both the air return vent 31 of the first temperature control component 3 and the air return vent 41 of the second temperature control component 4 are communicated with the hot area B2 at the top of the placement space B. Therefore, during operation of the temperature control components in the temperature control cabinet 01 provided in this embodiment of this application, the air entering the return air vents is the high-temperature air from the hot area B2. This can eliminate an air duct short circuit influence between a plurality of temperature control components. In addition, return air temperatures of the temperature control components are more uniform, to ensure that the temperature control components can operate with high efficiency, and the temperature control capability of the temperature control cabinet 01 can be improved. Moreover, since the temperature control components operate in a same return air temperature range, useful lives of the temperature control components can be prolonged.

Figure 8:
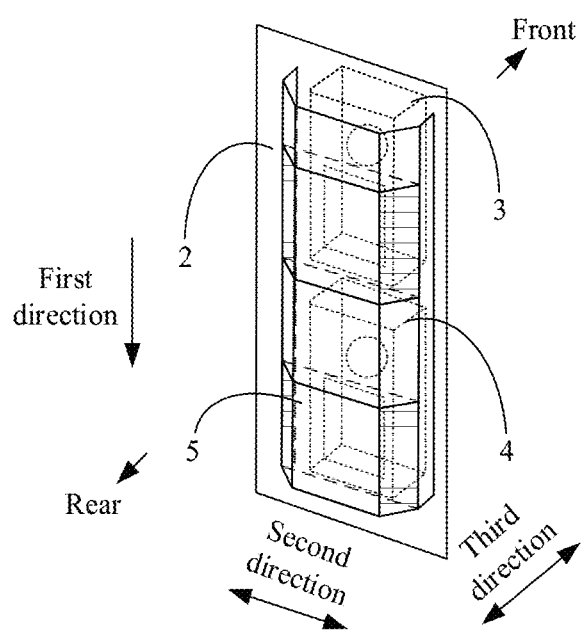
FIG. 8 is a diagram of a stereoscopic structure of an air duct mechanical part in FIG. 7 after being mounted.

FIG. 8 is a diagram of a stereoscopic structure of the air duct mechanical part 5 in FIG. 7 after being mounted. The air duct mechanical part 5 abuts against the inner surface of the cabinet door 2 on the front side, and the air duct mechanical part 5 is matched with the first temperature control component 3 and the second temperature control component 4. Specifically, the air duct mechanical part 5 includes a first air duct mechanical part and a second air duct mechanical part. The first air duct mechanical part corresponds to the first temperature control component 3, and the second air duct mechanical part corresponds to the second temperature control component 4. Since the first air duct mechanical part and the second air duct mechanical part in FIG. 8 are integral structures, the first air duct mechanical part and the second air duct mechanical part are not separately shown with reference numerals. It should be noted that the integral structures are easy to manufacture. Certainly, the first air duct mechanical part and the second air duct mechanical part may alternatively be disposed as split structures according to a requirement, and may be mounted together with the corresponding temperature control components, to facilitate mounting and maintenance operations.

Figure 9:
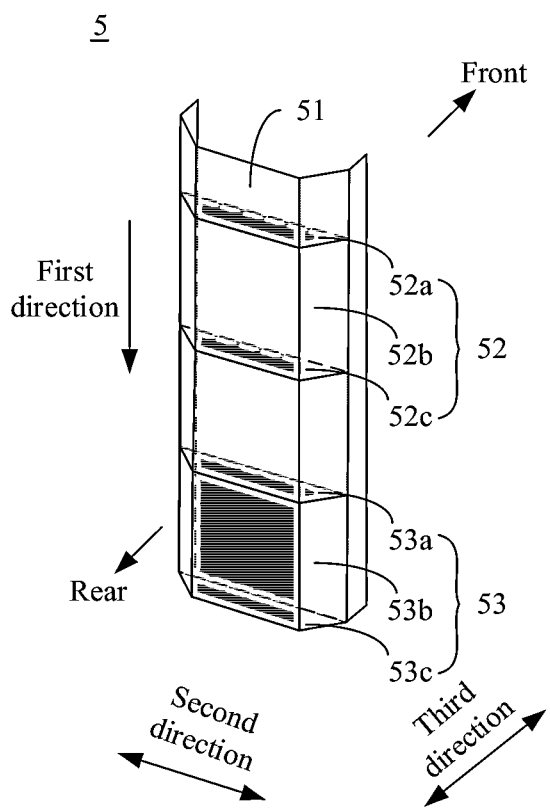
FIG. 9 and FIG. 10 are diagrams of an exemplary structure of the air duct mechanical part.
Figure 10:
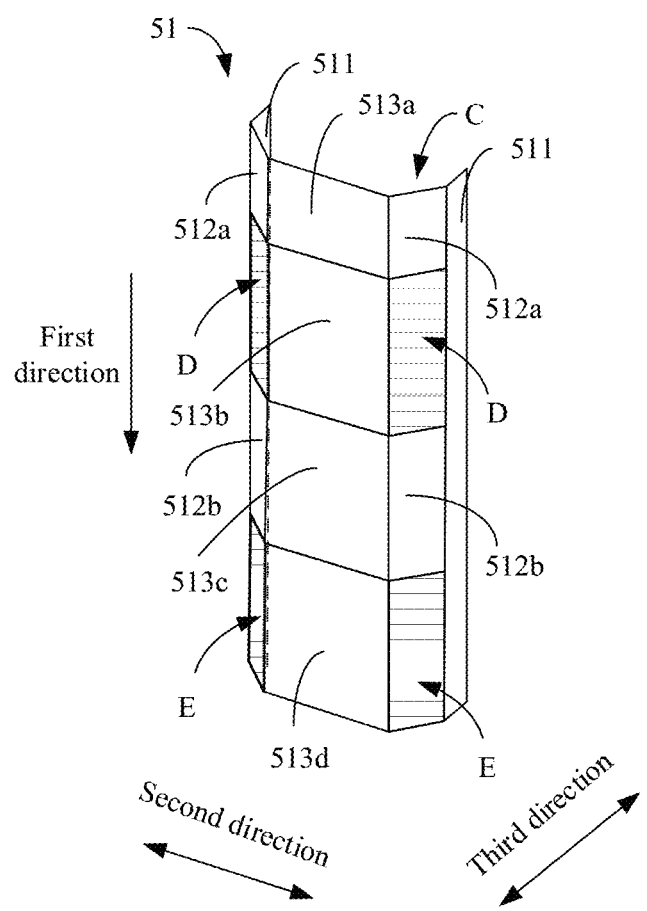

FIG. 9 and FIG. 10 are diagrams of an exemplary structure of the air duct mechanical part 5. As shown in FIG. 9, the air duct mechanical part 5 includes a first plate 51, a second plate 52, and a third plate 53. Both the second plate 52 and the third plate 53 are disposed on a side of the first plate 51 facing the temperature control components (namely, the first temperature control component 3 and the second temperature control component 4 shown in FIG. 8). Specifically, the second plate 52 includes a plate 52a, a plate 52b, and a plate 52c, where the plate 52a and the plate 52c are disposed on a same side of the first plate 51 and are disposed opposite to each other in the first direction, and the plate 52b is connected to one end of each of the plate 52a and the plate 52c away from the first plate 51. The third plate 53 includes a plate 53a, a plate 53b, and a plate 53c, where the plate 53a and the plate 53c are disposed on a same side of the first plate 51 and are disposed opposite to each other in the first direction, and the plate 53b is connected to one end of each of the plate 53a and the plate 53c away from the first plate 51.

It should be understood that the plate 52a, the plate 52b, and the plate 52c in the second plate 52 may be split structures or may be formed by bending one plate. Similarly, the plate 53a, the plate 53b, and the plate 53c in the third plate 53 may be split structures or may be formed by bending one plate. It should be noted that the plate 52a, the plate 52c, the plate 53a, and the plate 53c in FIG. 9 divide the first plate 51 into a plurality of areas in the first direction. Certainly, the plate 53c may not be disposed when the air duct mechanical part 5 abuts against the bottom surface of the subrack 1.

Refer to the structure shown in FIG. 10 with reference to FIG. 9. The first plate 51 includes two plates 511 disposed parallel to each other on both sides in the second direction, and a plurality of plates disposed between the two plates 511. Specifically, in addition to including the plates 511, the first plate 51 may further include: two plates 512a symmetrically disposed in the second direction and a plate 513a between the two plates 512a; two plates 512b symmetrically disposed in the second direction and a plate 513c between the two plates 512b; a plate 513b disposed between the plate 513a and the plate 513c in the first direction; and a plate 513d disposed in the first direction on a side of the plate 513c away from the plate 513b. It should be noted that the foregoing adjacent plates are connected to each other. Certainly, the plate 53c may not be disposed when the air duct mechanical part 5 abuts against the bottom surface of the subrack 1.

Continue to refer to the structure shown in FIG. 10. The air duct mechanical part 5 is formed with an opening C, symmetrically disposed openings D, and symmetrically disposed openings E. The opening C synchronously serves as a hot air intake vent for both a hot air duct in the first air duct mechanical part and a hot air duct in the second air duct mechanical part; and the openings D serve as cold air exhaust vents of a cold air duct in the first air duct mechanical part, and the openings E serve as cold air exhaust vents of a cold air duct in the second air duct mechanical part. Exemplary structures of the hot air duct and the cold air duct in the first air duct mechanical part and the hot air duct and the cold air duct in the second air duct mechanical part are shown in FIG. 11.

Figure 11:
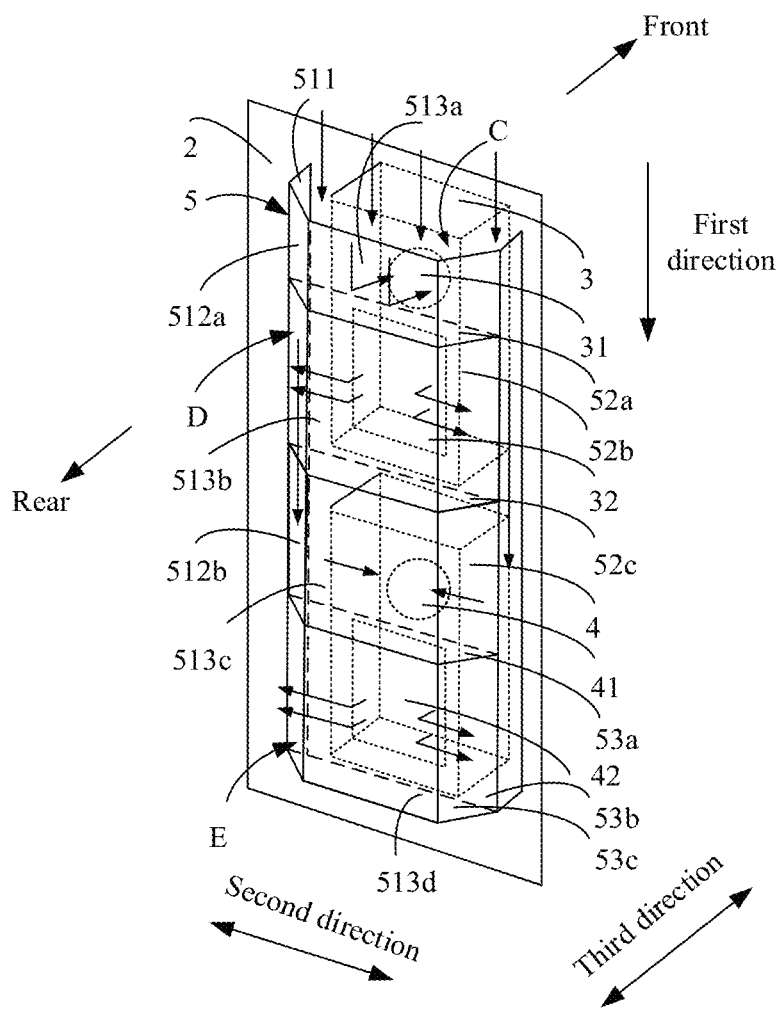
FIG. 11 is a schematic diagram of air guidance of the air duct mechanical part in FIG. 9 and FIG. 10.

Refer to the structure shown in FIG. 11. The plates 511 on both sides in the air duct mechanical part 5 abuts against the inner surface of the cabinet door 2. The plates 511, the plates 512a, the plate 513a, the plate 52a, and the surface of the first temperature control component 3 form the hot air duct of the first air duct mechanical part. The plate 52a, the plate 52b, and the plate 52c form the cold air duct of the first air duct mechanical part. The plates 511, the plates 512b, the plate 52c, the plate 513c, the plate 53a, the surface of the first temperature control mechanical part 3, and the surface of the second temperature control mechanical part 4 form the hot air duct of the second air duct mechanical part. The plate 53a, the plate 53b, the plate 53c, and the plate 513d form the cold air duct of the second air duct mechanical part. It should be understood that both the hot air ducts and the cold air ducts are a part of internal circulation of the temperature control cabinet provided in this embodiment of this application. Certainly, the temperature control cabinet is further provided with an external circulation structure, and the external circulation structure is not described herein again.

It should be noted that a cold air intake vent of the cold air duct of the first air duct mechanical part is disposed on the plate 52b, to connect to the air exhaust vent of the first temperature control component 3. Similarly, a cold air intake vent of the cold air duct of the second air duct mechanical part is disposed on the plate 53b, to connect to the air exhaust vent of the second temperature control component 4. Since the cold air intake vents of the first air duct mechanical part and the second air duct mechanical part have same sizes with the air exhaust vents of the temperature control components, the cold air intake vents are not shown with reference numerals. It should be understood that, since neither the hot air duct of the first air duct mechanical part nor the hot air duct of the second air duct mechanical part is completely closed, no hot air exhaust vent is provided. After entering a hot air duct, air can be directly input to the return air vent of the temperature control component corresponding to the hot air duct.

Continue to refer to the structure shown in FIG. 11. Arrow directions in FIG. 11 are air flowing directions. An exemplary air flowing process is as follows: The high-temperature air enters the hot air duct of the first air duct mechanical part from the opening C, and a part of the air enters the return air vent of the first temperature control component 3. After being cooled by the first temperature control component 3, the air is output to the cold air duct of the first air duct mechanical part through the air exhaust vent. Since the plate 513b is disposed in an air exhaust direction of the air exhaust vent 32 of the first temperature control component 3, a flowing direction of the low-temperature air is changed, and the low-temperature air is finally output through the cold air exhaust vent D. It should be noted that, since there is a gap between the plates 511 and the first temperature control component 3, after the high-temperature air enters the hot air duct of the first air duct mechanical part from the opening C, a part of the high-temperature air may enter the hot air duct of the second air duct mechanical part through the gap between the plates 511 and the first temperature control component 3 and a gap between the plates 511 and the second temperature control component 4 and then enter the return air vent of the second temperature control component 4, and after being cooled by the second temperature control component 4, this part of the high-temperature air is output to the cold air duct of the second air duct mechanical part through the air exhaust vent. Since the plate 513d is disposed in an air exhaust direction of the air exhaust vent 42 of the second temperature control component 4, the flowing direction of the low-temperature air is changed, and the low-temperature air is finally output through the cold air exhaust vents E. Certainly, a backfill prevention structure may be provided to prevent air from entering the air return vent of the second temperature control component 4 from the bottom of the subrack 1.

It should be noted that the hot air duct of the second air duct mechanical part is located on both sides of the first temperature control component 3 in the second direction. In other words, the first temperature control component 3 is partially embedded into the air duct mechanical part 5 in the third direction. This structure can reduce space occupied by the air duct mechanical part 5 in the subtract 1 in the third direction (namely, the depth direction), so that the air duct mechanical part 5 can be made thin.

Certainly, a necessary active maintenance window that can be opened or closed at any time may be reserved on the air duct mechanical part 5. It should be understood that an operator may dismount the active maintenance window from the air duct mechanical part 5 when necessary, to perform wiring or parameter setting on the first temperature control component 3 or the second temperature control component 4, or monitor and view a display screen of the first temperature control component 3 or the second temperature control component 4.

Figure 12:
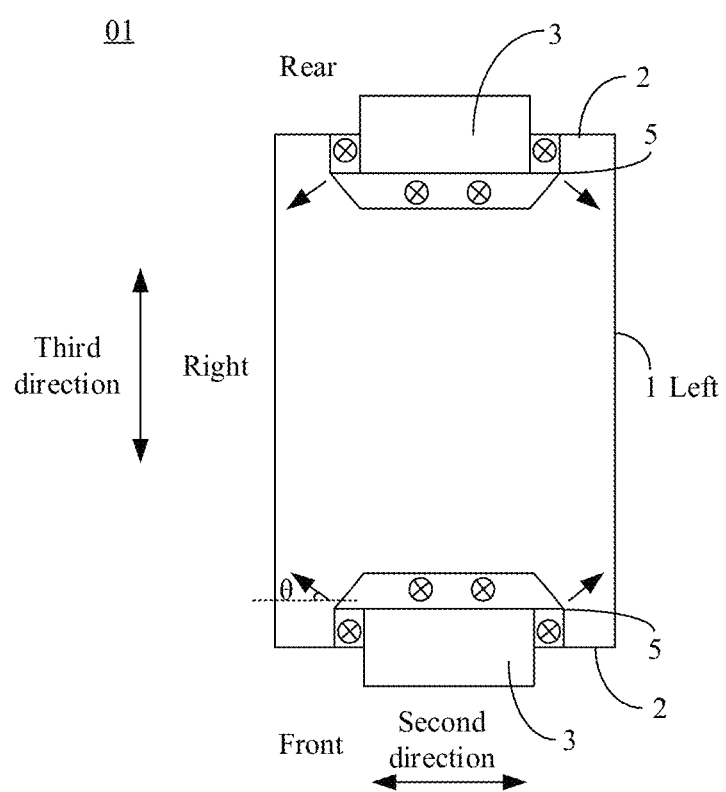
FIG. 12 is a top view of the temperature control cabinet according to Embodiment 1 of this application.

FIG. 12 is a top view of the temperature control cabinet 01 according to this embodiment of this application. FIG. 12 shows a flowing direction of air output from each air duct mechanical part 5, where ⊗ indicates that air flows toward the inside of the air duct mechanical part 5. The air output from the air duct mechanical part 5 is blown to a side surface of the subrack 1, so that the device 02 in the placement space B can be prevented from being directly blown, thereby preventing the device 02 from being condensed in a specific scenario.

It should be noted that an air exhaust direction of the cold air exhaust vent of the first air duct mechanical part has a first included angle θ with the second direction, and an angle range of the first included angle θ is greater than or equal to 0° and less than 90°. Due to a structure angle problem of the temperature control cabinet 01, FIG. 12 only shows the first included angle θ as an example. Certainly, an air exhaust direction of the cold air exhaust vent of the second air duct mechanical part has a second included angle with the second direction, and an angle range of the second included angle is greater than or equal to 0° and less than 90°. It should be noted that, in this implementation, the first included angle and the second included angle may be set according to a requirement, and details are not described herein.

Embodiment 2

Figure 13:
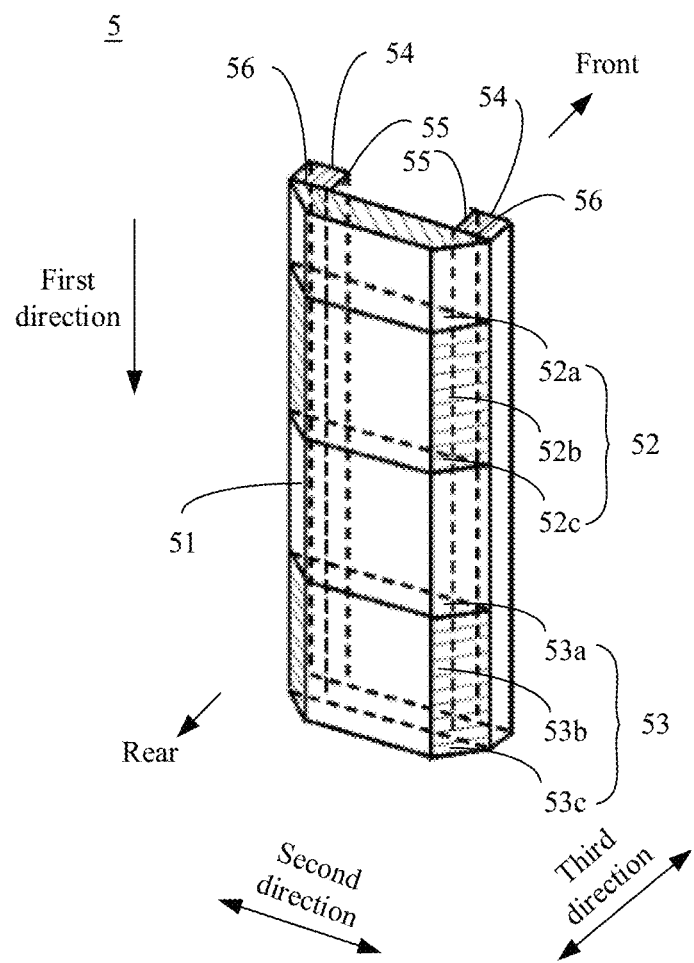
FIG. 13 is a diagram of an exemplary structure of an air duct mechanical part according to Embodiment 2 of this application.

FIG. 13 shows an exemplary structure of an air duct mechanical part 5 in this embodiment of this application. A difference between Embodiment 2 and Embodiment 1 is only that the structure of the air duct mechanical part 5 is different. Refer to the structure shown in FIG. 13. The air duct mechanical part 5 further includes fourth plates 54, fifth plates 55, and sixth plates 56 in addition to a first plate 51, a second plate 52, and a third plate 53. The fourth plates 54, the fifth plates 55, and the sixth plates 56 are connected sequentially and are matched with the first plate 51 to form a columnar cavity structure.

Figure 14:
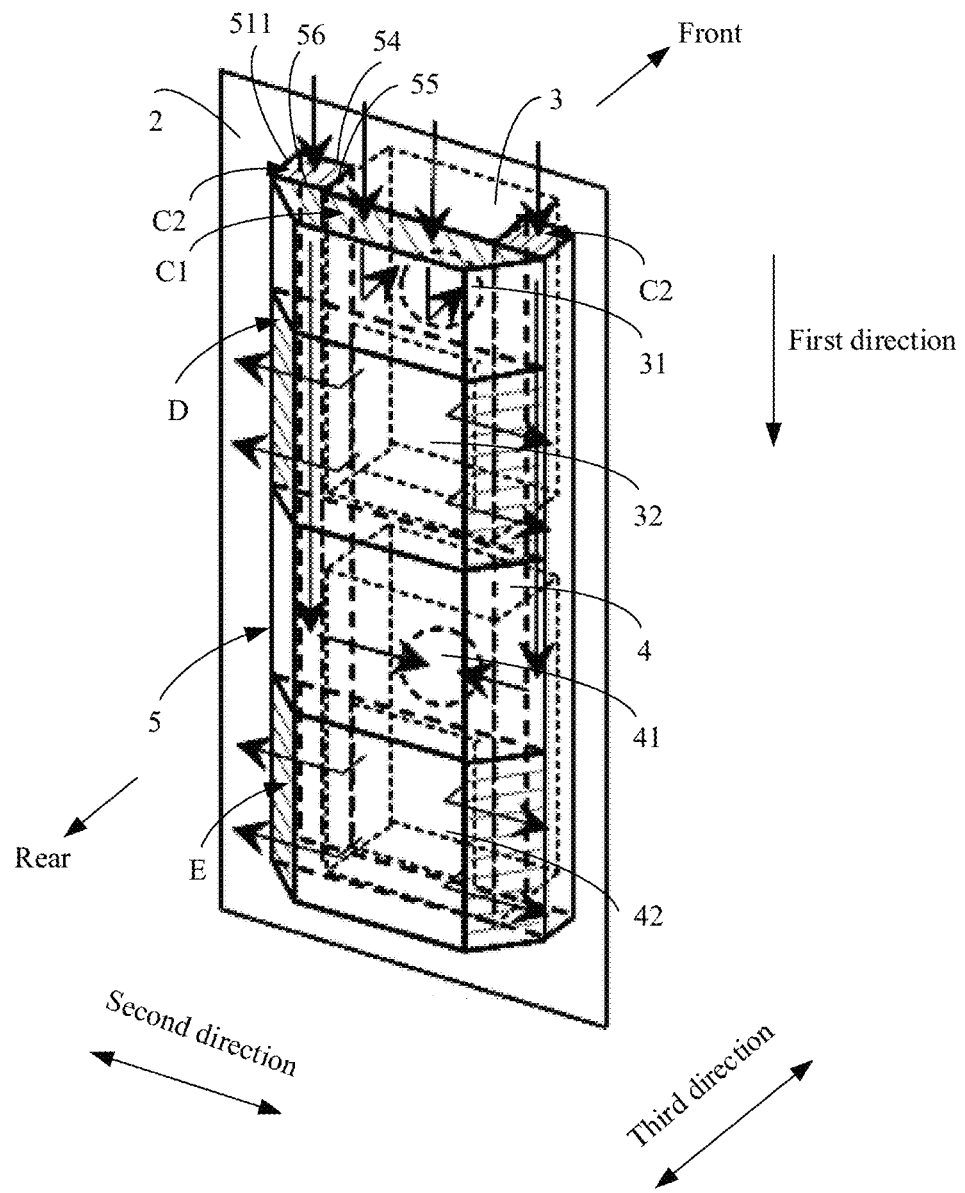
FIG. 14 is a schematic diagram of air guidance of the air duct mechanical part in FIG. 13 after being mounted.

FIG. 14 is a schematic diagram of the structure of the air duct mechanical part 5 in FIG. 13 after being mounted. Arrow directions in FIG. 14 are air flowing directions. An exemplary flowing process is as follows: A part of high-temperature air enters a hot air duct of a first air duct mechanical part from an opening C1, and then enters a return air vent 31 of a first temperature control component 3. After the first temperature control component 3 cools this part of high-temperature air, an air exhaust vent 32 of the first temperature control component 3 outputs low-temperature air to a cold air duct of the first air duct mechanical part. Finally, the low-temperature air is output through a cold air exhaust vent D. Simultaneously, a part of the high-temperature air enters a hot air duct of a second air duct mechanical part from an opening C2, and then enters a return air vent 41 of a second temperature control component 4. After the second temperature control component 4 cools this part of high-temperature air, an air exhaust vent 42 of the second temperature control component 4 outputs low-temperature air to a cold air duct of the second air duct mechanical part. Finally, the low-temperature air is output through a cold air exhaust vent E.

A temperature control cabinet 01 provided in this embodiment of this application uses the air duct mechanical part 5, and an air duct group in the air duct mechanical part 5 is separately connected to the first temperature control component 3 and the second temperature control component 4, so that the air entering the air return vent 31 of the first temperature control component 3 and the air entering the air return vent 41 of the second temperature control component 4 are both high-temperature air, and an air duct short circuit influence between a plurality of temperature control components can be eliminated. In addition, return air temperatures of the temperature control components are more uniform, to ensure that the temperature control components can operate with high efficiency, and a temperature control capability of the temperature control cabinet 01 can be improved. Moreover, since the temperature control components operate in a same return air temperature range, useful lives of the temperature control components can be prolonged.

It should be noted that, in the structure shown in FIG. 14, the hot air duct of the second air duct mechanical part is divided into two parts and is located on both sides of the first temperature control components 3 in a second direction. In other words, the first temperature control component 3 is partially embedded into the air duct mechanical part 5 in a third direction. It should be understood that this structure can reduce space occupied by the air duct mechanical part 5 in a subtract 1 in the third direction (namely, a depth direction), so that the air duct mechanical part 5 can be made thin.

Certainly, when the air duct mechanical part 5 abuts against a surface of a cabinet door 2, the cabinet door 2 may form a part of an air duct. In this case, the fourth plate 54 may not be disposed. Similarly, the fifth plate 55 may be omitted when the air duct mechanical part abuts against side surfaces of the first temperature control component 3 and the second temperature control component 4.

Since a top view of the temperature control cabinet 01 provided in this embodiment of this application is the same as the structure shown in FIG. 12 in Embodiment 1, the top view is not shown in the figure. In this embodiment of this application, an air leading-out direction of the air duct mechanical part 5 is also the same as that in the structure shown in FIG. 12 in Embodiment 1. The air duct mechanical part 5 leads the low-temperature air to a side surface of the subrack 1, so that a device 02 in a placement space B can be prevented from being directly blown, thereby preventing the device 02 from being condensed in a specific scenario.

Embodiment 3

Figure 15:
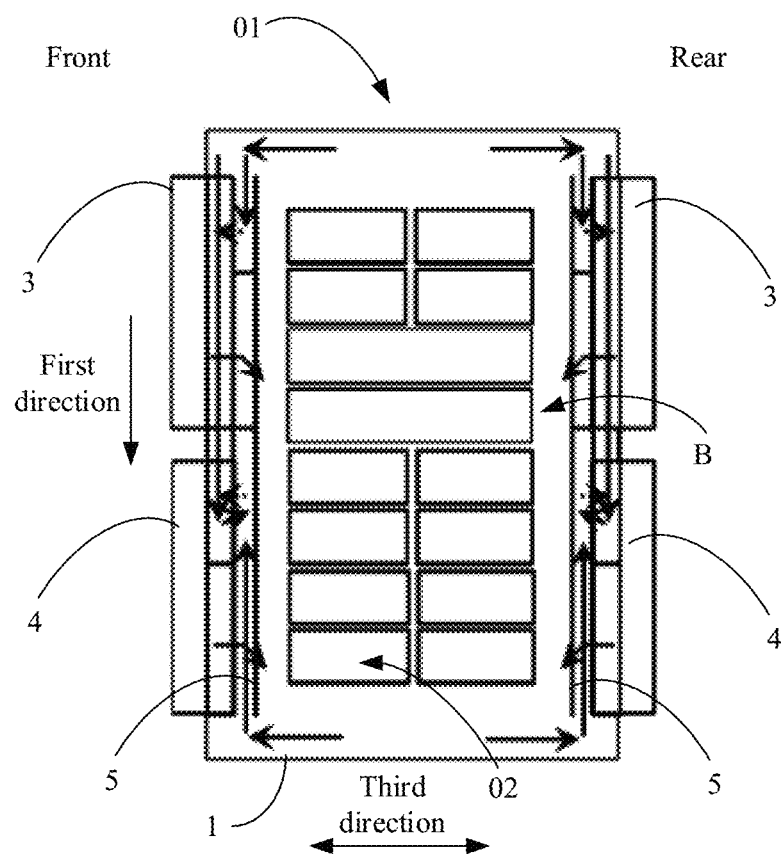
FIG. 15 is another diagram of a structure of the temperature control cabinet and the device viewed in the direction a in FIG. 5.
Figure 16:
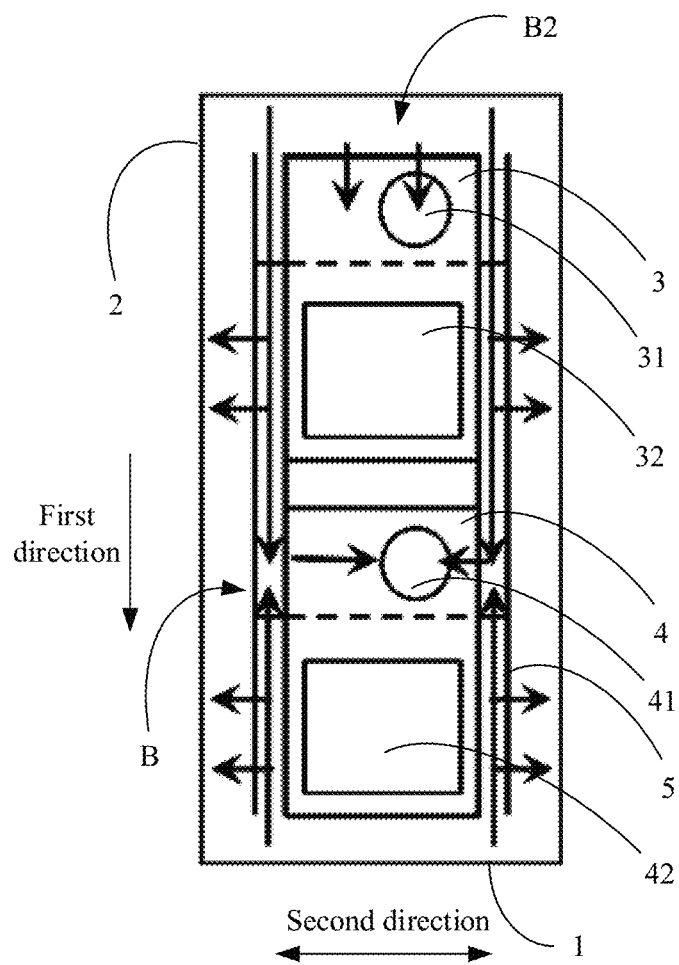
FIG. 16 is another diagram of a structure of the temperature control structure in FIG. viewed in the third direction.
Figure 17:
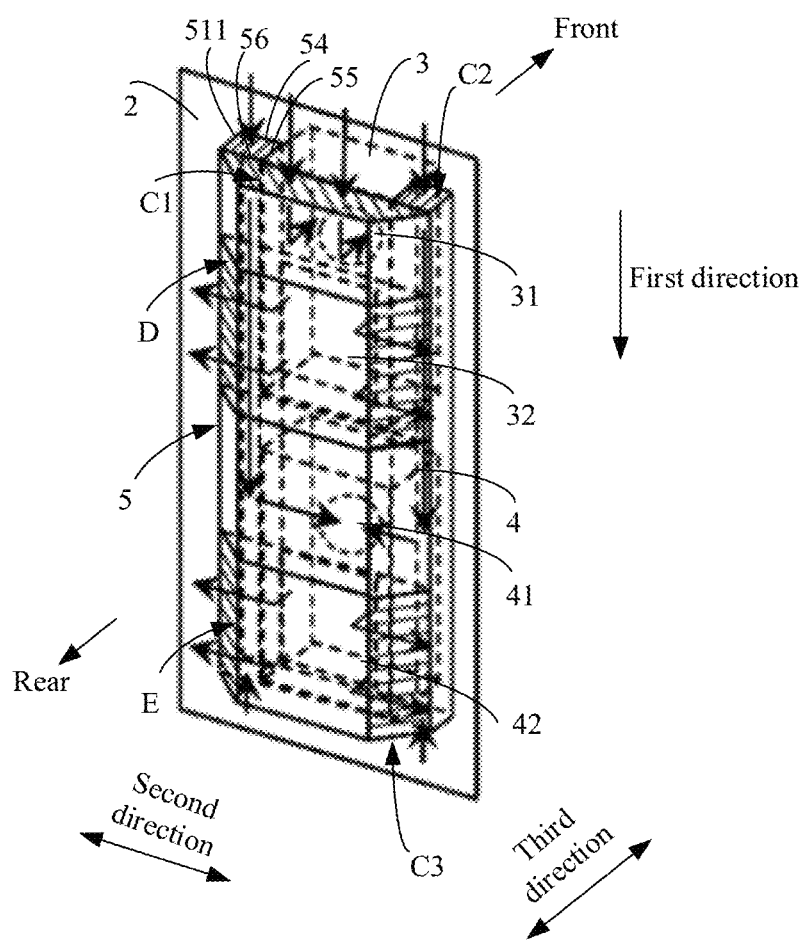
FIG. 17 is a diagram of a stereoscopic structure of the air duct mechanical part in FIG. 16 after being mounted.

FIG. 15 is another diagram of a structure of the temperature control cabinet 01 and the device 02 viewed in the direction a in FIG. 5; FIG. 16 is a diagram of a structure of the temperature control structure 01 in FIG. 5 viewed in the third direction; and FIG. 17 is a diagram of a stereoscopic structure of the air duct mechanical part 5 in FIG. 16 after being mounted. Embodiment 3 differs from Embodiment 2 only in that the structure of the air duct mechanical part 5 is different. Refer to the structure shown in FIG. 17. The air duct mechanical part 5 in Embodiment 3 further includes an auxiliary air duct, and the auxiliary air duct is connected to the return air vent of the second temperature control component 4.

Specifically, as shown in FIG. 17, the plate 511, the fourth plate 54, the fifth plate and the sixth plate 56 form a columnar cavity structure located at the bottom of the air duct mechanical part 5. The lower part of the columnar cavity structure forms the auxiliary air duct, and an auxiliary intake vent of the auxiliary air duct is C3 marked in FIG. 17. The auxiliary exhaust vent of the auxiliary air duct is connected to the return air vent of the second temperature control component 4.

Arrow directions in FIG. 17 are air flowing directions. An exemplary flowing process is as follows: A part of high-temperature air enters the hot air duct of the first air duct mechanical part from an opening C1 and then enters the return air vent 31 of the first temperature control component 3, the air exhaust vent 32 of the first temperature control component 3 outputs low-temperature air to the cold air duct of the first air duct mechanical part after the first temperature control component 3 cools this part of high-temperature air, and finally, the low-temperature air is output through the cold air exhaust vent D; a part of the high-temperature air enters the hot air duct of the second air duct mechanical part through an opening C2, a part of the air simultaneously enters the second air duct mechanical part through the auxiliary intake vent C3 of the auxiliary air duct, then the two parts of the air enter the return air vent 41 of the second temperature control component 4, and the air exhaust vent 42 of the second temperature control component 4 outputs low-temperature air to the cold air duct of the second air duct mechanical part after the second temperature control component 4 cools the two parts of the air; and finally, the low-temperature air is output through the cold air exhaust vent E.

An advantage of this embodiment is that the second temperature control component 4 can separately return air from the top and the bottom of the subrack 1 while a cold air short circuit problem is eliminated for the first temperature control component 3 and the second temperature control component 4, thereby resolving a problem that an air path for returning air only from the top is long and an operating point of an air conditioning fan is affected.

Since a top view of the temperature control cabinet 01 provided in this embodiment of this application is the same as the structure shown in FIG. 15 in Embodiment 3, the top view is not shown in the figure. In Embodiment 3 of this application, an air leading-out direction of the air duct mechanical part 5 is also the same as that in the structure shown in FIG. 15 in Embodiment 2. The air duct mechanical part 5 leads the low-temperature air to a side surface of the subrack 1, so that the device 02 in a placement space B can be prevented from being directly blown, thereby preventing the device 02 from being condensed in a specific scenario.

Embodiment 4

Figure 18:
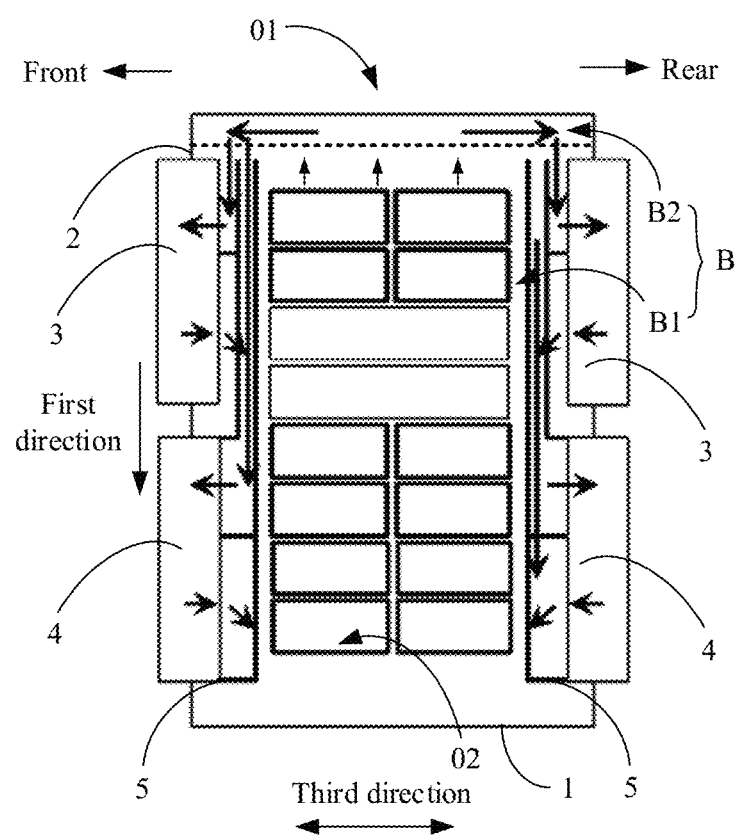
FIG. 18 is another diagram of a structure of the temperature control cabinet and the device viewed in the direction a in FIG. 5.
Figure 19:
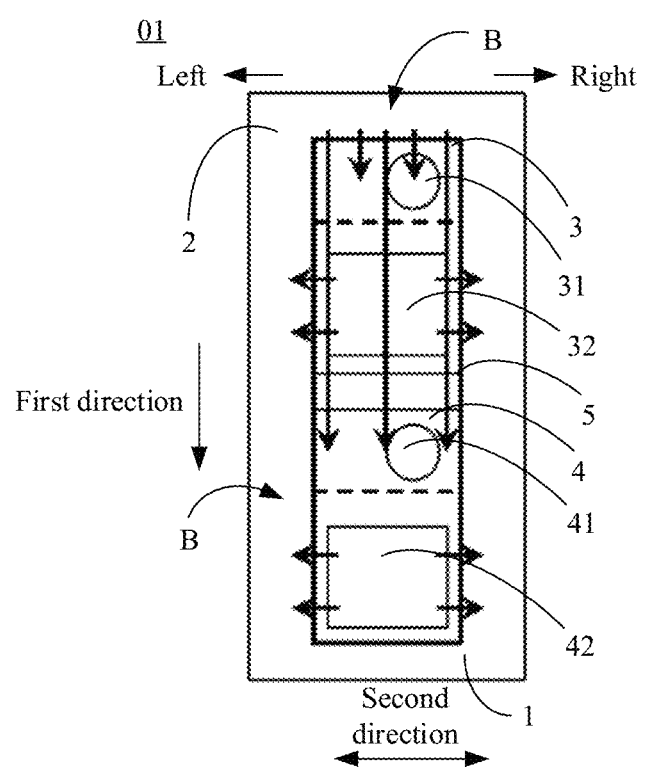
FIG. 19 is another diagram of a structure of the temperature control structure in FIG. viewed in the third direction.
Figure 20:
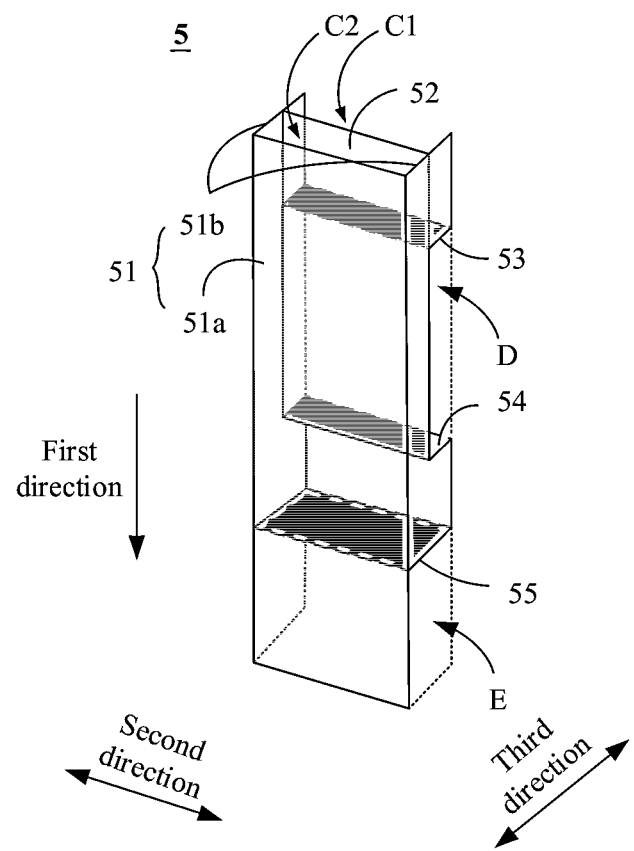
FIG. 20 is a diagram of an exemplary structure of an air duct mechanical part in FIG. 19.

FIG. 18 is another diagram of a structure of the temperature control cabinet 01 and the device 02 viewed in the direction a in FIG. 5; FIG. 19 is a diagram of a structure of the temperature control structure 01 in FIG. 5 viewed in the third direction; and FIG. 20 is a diagram of an exemplary structure of the air duct mechanical part 5.

Embodiment 4 differs from Embodiment 1 only in that the structure of the air duct mechanical part 5 is different. Refer to the structure shown in FIG. 20. The air duct mechanical part 5 includes a first plate 51, a second plate 52, a third plate 53, a fourth plate 54, and a fifth plate 55. Certainly, the exemplary structure of the air duct mechanical part 5 in Embodiment 4 of this application is not limited to the division of the foregoing plates.

Specifically, the first plate 51 includes a plate 51a and two plates 51b extending from the plate 51a and disposed on a same side of the plate 51a. The second plate 52 is disposed between the two plates 51b and parallel to the plate 51a, and the second plate 52 has an exemplary distance from the bottom of the first plate 51. The third plate 53 and the fourth plate 54 are arranged in sequence in a first direction and are perpendicular to the second plate 52. The third plate 53 has an exemplary distance from the top of the second plate 52, and the fourth plate 54 is located at the bottom of the second plate 52. It should be noted that the third plate 53 and the fourth plate 54 are located on a side of the second plate 52 away from the first plate 51, and there is an exemplary distance between the third plate 53 and the fourth plate 54. The fifth plate 55 is perpendicular to the first plate 51, and is located on a side of the fourth plate 54 away from the third plate 53. Certainly, the foregoing adjacent plates are connected to each other.

It should be understood that the plate 51a and the plates 51b in the first plate 51 may be split structures or may be formed by bending one plate. Similarly, the foregoing plates may be made into split structures according to a requirement, or may be formed by using a bending process.

Continue to refer to the structure shown in FIG. 20. The air duct mechanical part 5 is formed with an opening C1, an opening C2, symmetrically disposed openings D, and symmetrically disposed openings E. The opening C1 serves as a hot air intake vent of a hot air duct in a first air duct mechanical part, and the opening C2 serves as a hot air intake vent of a hot air duct in a second air duct mechanical part; and the openings D serve as cold air exhaust vents of a cold air duct in the first air duct mechanical part, and the openings E serve as cold air exhaust vents of a cold air duct in the second air duct mechanical part. Exemplary structures of the hot air duct and the cold air duct in the first air duct mechanical part and the hot air duct and the cold air duct in the second air duct mechanical part are shown in FIG. 21.

Figure 21:
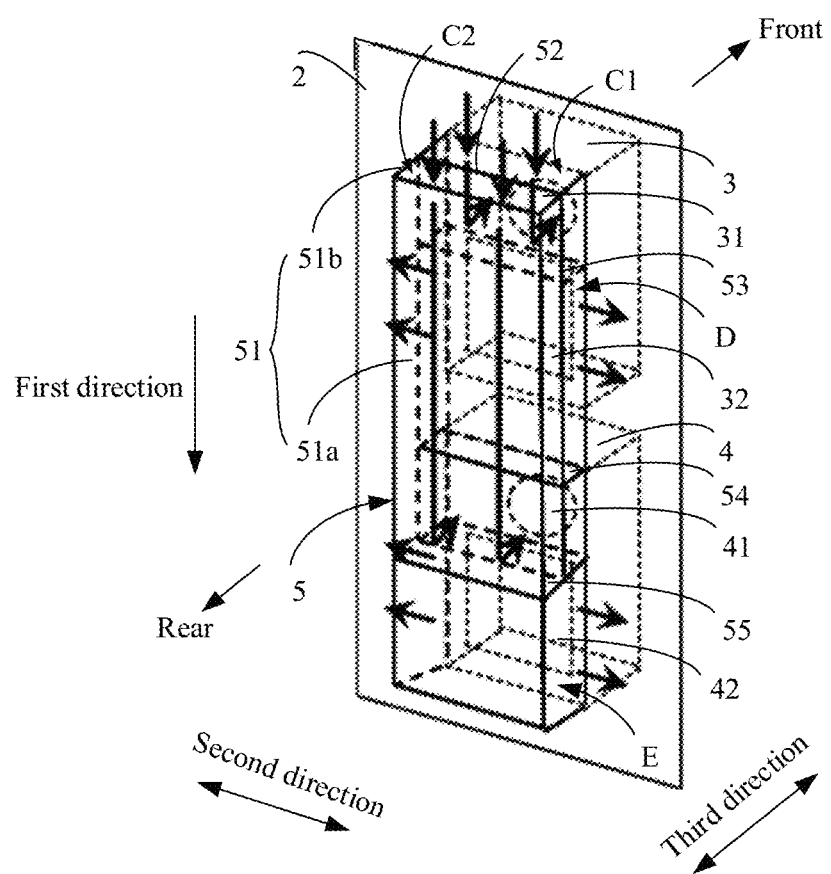
FIG. 21 is a diagram of a stereoscopic structure of the air duct mechanical part in FIG. 20 after being mounted.

FIG. 21 is a diagram of a stereoscopic structure of the air duct mechanical part 5 in FIG. 20 after being mounted. Refer to a structure shown in FIG. 21 with reference to FIG. 20. The two plates 51b of the first plate 51 abut against the inner surface of a cabinet door 2. The plates 51b, the second plate 52, the third plate 53, and a surface of a first temperature control component 3 form the hot air duct of the first air duct mechanical part. The third plate 53, the fourth plate 54, and a part that is of the second plate 52 and that is between the third plate 53 and the fourth plate 54 form the cold air duct of the first air duct mechanical part. The first plate 51, the second plate 52, the fourth plate 54, the fifth plate 55, and a surface of a second temperature control mechanical part 4 form the hot air duct of the second air duct mechanical part. The plate 51a and the fifth plate 55 form the cold air duct of the second air duct mechanical part.

It should be noted that it should be understood that since neither the cold air duct of the first air duct mechanical part nor the cold air duct of the second air duct mechanical part is completely closed, no cold air intake vent is provided, and air exhausted from the temperature control components can directly enter corresponding cold air ducts.

Continue to refer to the structure shown in FIG. 21. Arrow directions in FIG. 21 are air flowing directions. An exemplary flowing process is as follows: A part of high-temperature air enters the hot air duct of the first air duct mechanical part from the opening C1, and then enters a return air vent 31 of the first temperature control component 3. After the first temperature control component 3 cools this part of high-temperature air, an air exhaust vent 32 of the first temperature control component 3 outputs low-temperature air to the cold air duct of the first air duct mechanical part. Since the second plate 52 is disposed in an air exhaust direction of the air exhaust vent 31 of the first temperature control component 3 and the air exhaust direction is changed, the low-temperature air is finally output through the cold air exhaust vents D. Simultaneously, a part of the high-temperature air enters the hot air duct of the second air duct mechanical part from the opening C2, and then enters a return air vent 41 of the second temperature control component 4. After the second temperature control component 4 cools this part of high-temperature air, an air exhaust vent 42 of the second temperature control component 4 outputs low-temperature air to the cold air duct of the second air duct mechanical part. Since the plate 51a of the first plate 51 is disposed in an air exhaust direction of the air exhaust vent 41 of the second temperature control component 4 and the air exhaust direction is changed, the low-temperature air is finally output through the cold air exhaust vents E.

The temperature control cabinet 01 provided in this embodiment of this application uses the air duct mechanical part 5, and an air duct group in the air duct mechanical part 5 is separately connected to the first temperature control component 3 and the second temperature control component 4, so that the air entering the air return vent 31 of the first temperature control component 3 and the air entering the air return vent 41 of the second temperature control component 4 are both high-temperature air, and an air duct short circuit influence between a plurality of temperature control components can be eliminated. In addition, return air temperatures of the temperature control components are more uniform, to ensure that the temperature control components can operate with high efficiency, and the temperature control capability of the temperature control cabinet 01 can be improved. Moreover, since the temperature control components operate in a same return air temperature range, useful lives of the temperature control components can be prolonged.

It should be noted that, in the structure shown in FIG. 21, the hot air intake vent C1 of the first air duct mechanical part and the hot air intake vent C2 of the second air duct mechanical part are arranged in a third direction. In other words, the two air duct mechanical parts are stacked in the third direction. The structure arrangement makes an overall structure design relatively simple, and is suitable for a space scenario in which the first temperature control component 3 and the second temperature control component 4 are wide in a second direction and cannot expand in the second direction.

Figure 22:
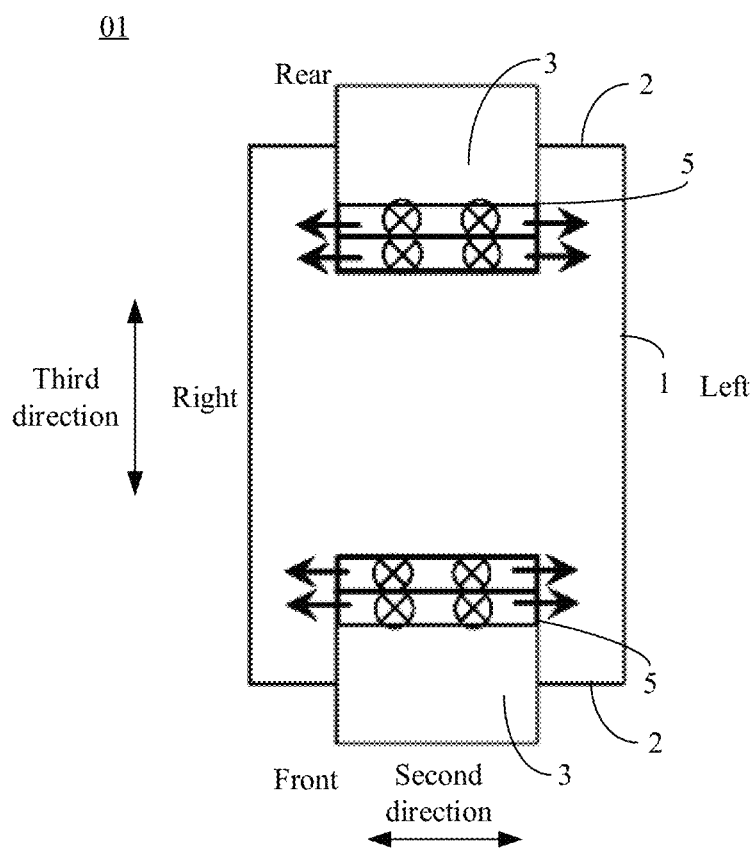
FIG. 22 is a top view of the temperature control cabinet according to Embodiment 4 of this application.

FIG. 22 is a top view of the temperature control cabinet 01 according to this embodiment of this application. An air exhaust direction of the cold air exhaust vent of the first air duct mechanical part is parallel to the second direction. In addition, an air exhaust direction of the cold air exhaust vent of the second air duct mechanical part is also parallel to the second direction. Obviously, in this embodiment of this application, an air leading-out direction of the air duct mechanical part 5 is perpendicular to a side surface of a subrack 1, and this arrangement can prevent the device 02 in a placement space B from being directly blown, thereby preventing the device 02 from being condensed in a specific scenario.

Embodiment 5

Figure 23:
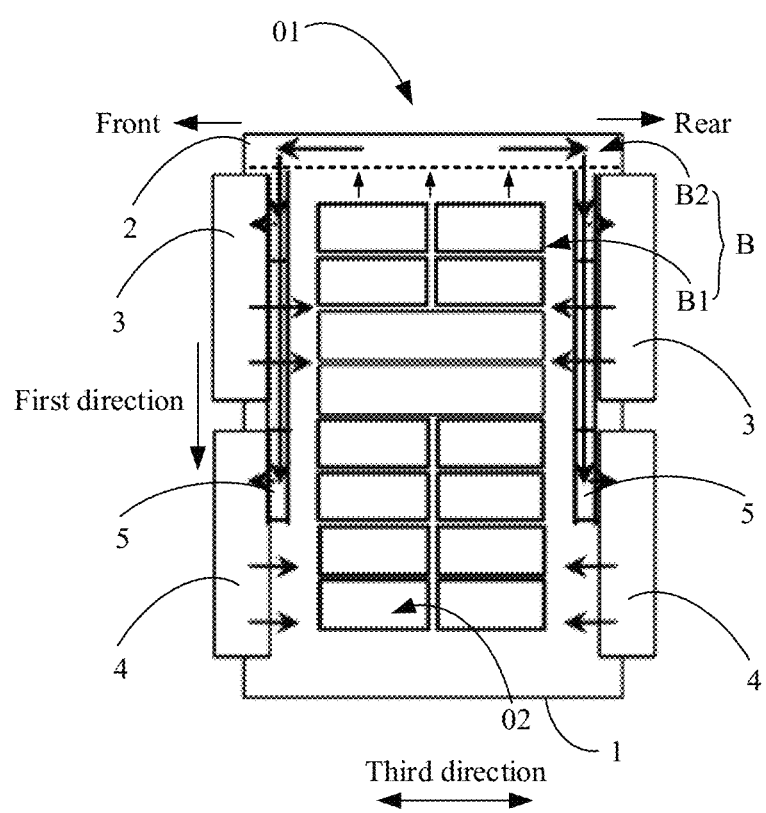
FIG. 23 is another diagram of a structure of the temperature control cabinet and the device viewed in the direction a in FIG. 5.
Figure 24:
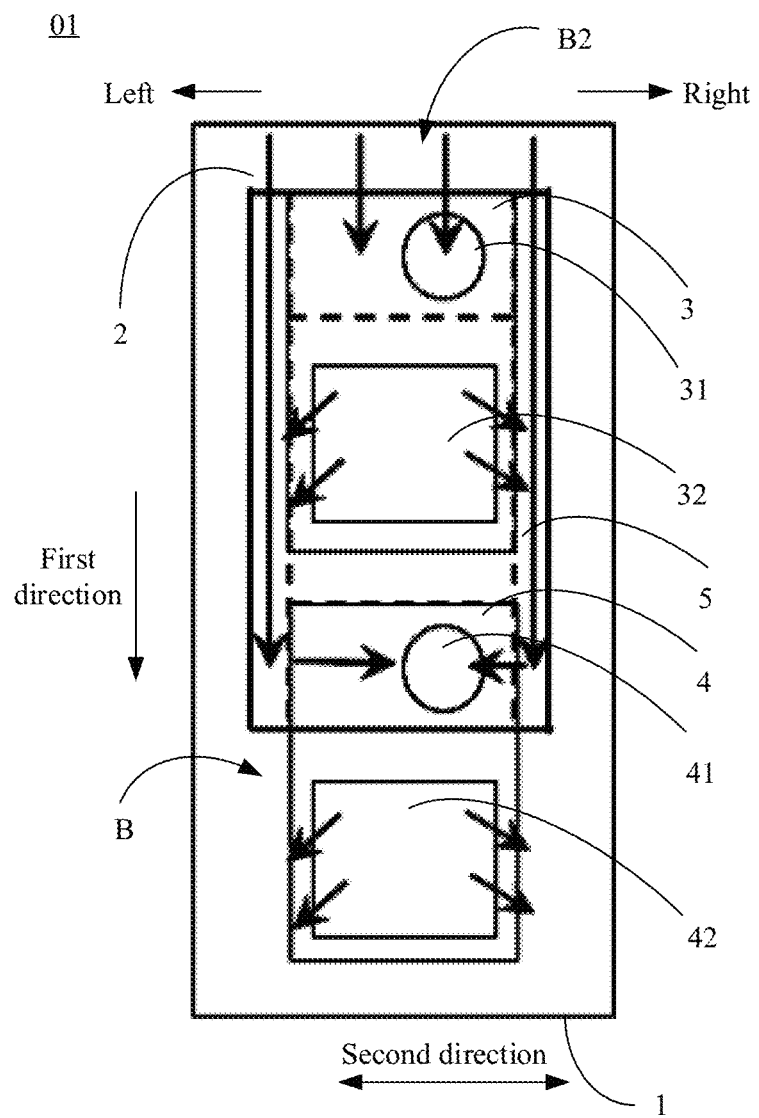
FIG. 24 is another diagram of a structure of the temperature control structure in FIG. viewed in the third direction.

FIG. 23 is another diagram of a structure of the temperature control cabinet 01 and the device 02 viewed in the direction a in FIG. 5; FIG. 24 is a diagram of a structure of the temperature control structure 01 in FIG. 5 viewed in the third direction; and FIG. 25 is a diagram of an exemplary structure of the air duct mechanical part 5.

This embodiment differs from Embodiment 1 only in that the structure of the air duct mechanical part 5 is different. Refer to the structure shown in FIG. 25. The air duct mechanical part 5 includes a first plate 51 and a second plate 52. The first plate 51 forms a U-shaped cavity structure, the second plate 52 is disposed on a side of the U-shaped cavity structure away from a U-shaped bottom, and plates 52a and 52b of the second plate 52 match with the inner side of the U-shaped cavity structure. The plate 52a and the plate 52b in the second plate 52 may be split structures or may be formed by bending one plate. Similarly, the first plate 51 may be made into split structures according to a requirement, or may be formed by using a bending process.

Figure 25:
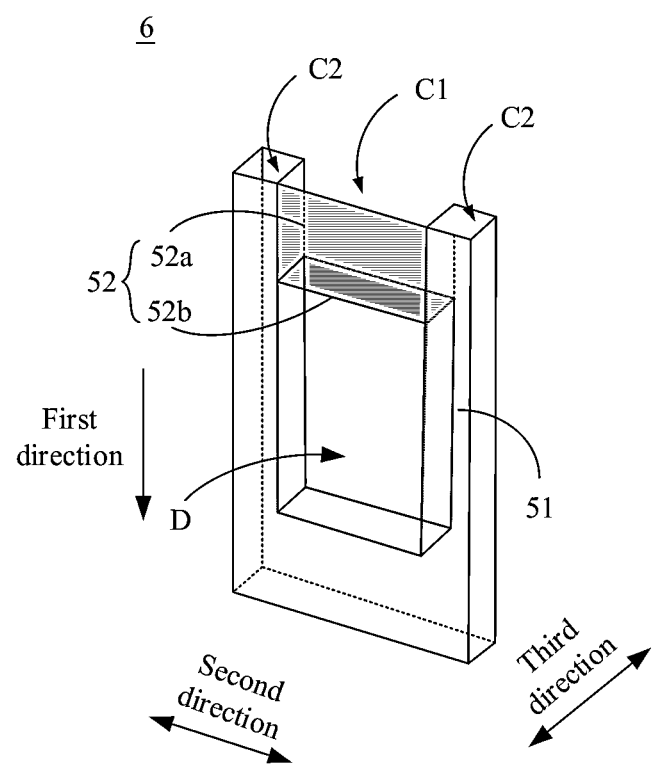
FIG. 25 is a diagram of an exemplary structure of an air duct mechanical part in FIG. 24.

Continue to refer to the structure shown in FIG. 25. The air duct mechanical part 5 is formed with an opening C1, two symmetrically disposed openings C2, and an opening D. The opening C1 serves as a hot air intake vent of a hot air duct in a first air duct mechanical part, the openings C2 serve as hot air intake vents of a hot air duct in a second air duct mechanical part, and the hot air intake vent C1 of the first air duct mechanical part is located between the hot air intake vents C2 of the two second air duct mechanical parts in a second direction. The opening D serves as a cold air exhaust vent of a cold air duct in the first air duct mechanical part. Exemplary structures of the hot air duct and the cold air duct in the first air duct mechanical part and the hot air duct and a cold air duct in the second air duct mechanical part are shown in FIG. 26.

Figure 26:
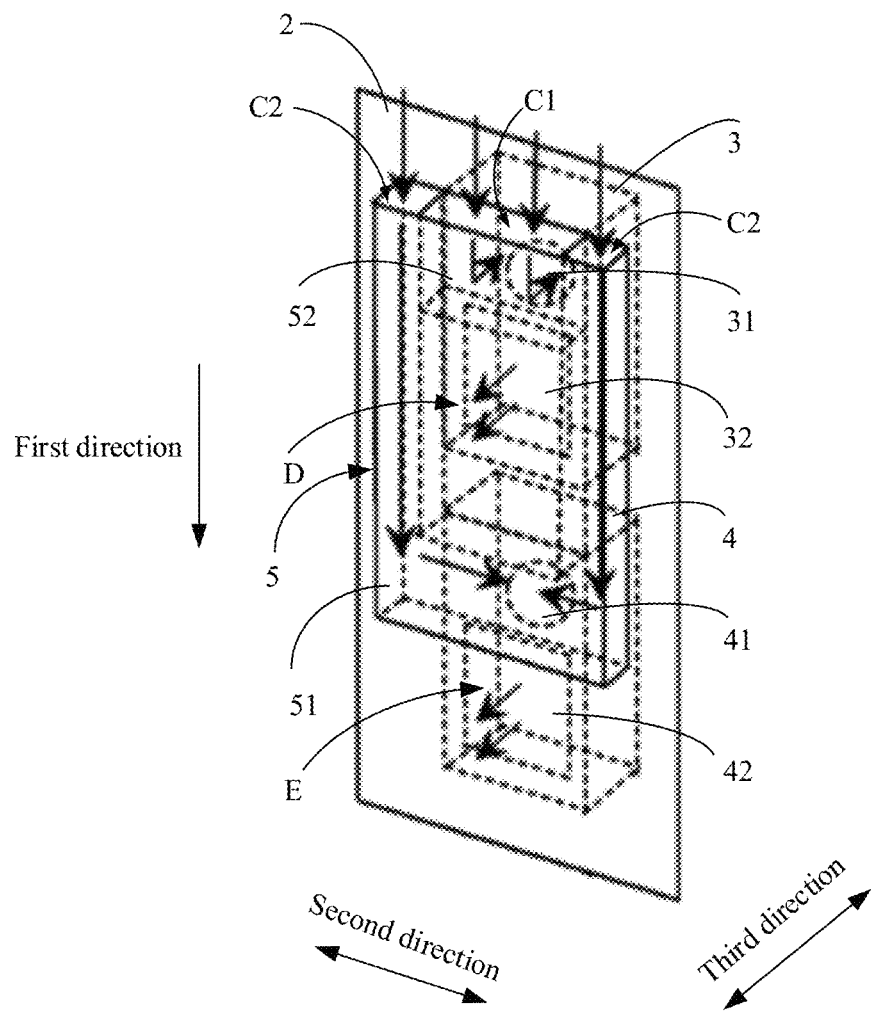
FIG. 26 is a diagram of a stereoscopic structure of the air duct mechanical part in FIG. 25 after being mounted.

FIG. 26 is a diagram of a stereoscopic structure of the air duct mechanical part 5 in FIG. 25 after being mounted. Refer to a structure shown in FIG. 26 with reference to FIG. 25. One side of the first plate 51 abuts against the inner surface of a cabinet door 2. The hot air duct of the first air duct mechanical part is formed between the first plate 51 and the second plate 52; the cold air duct of the first air duct mechanical part is formed between the plate 52b and the bottom of the U-shaped cavity structure; and the first plate 51 forms the hot air duct of the second air duct mechanical part. Since an air exhaust vent of a second temperature control component 4 is not shielded, the air exhaust vent of the second temperature control component 4 directly outputs low-temperature air. In other words, the air exhaust vent of the second temperature control component 4 can be a cold air exhaust vent of the cold air duct in the second air duct mechanical part.

It should be noted that it should be understood that since the cold air duct of the first air duct mechanical part is not completely closed, no cold air intake vent is provided, and air exhausted from a first temperature control component 3 can directly enter a corresponding cold air duct.

Continue to refer to the structure shown in FIG. 26. Arrow directions in FIG. 26 are air flowing directions. An exemplary flowing process is as follows: A part of high-temperature air enters the hot air duct of the first air duct mechanical part from the opening C1, and then enters a return air vent 31 of the first temperature control component 3. After the first temperature control component 3 cools this part of high-temperature air, an air exhaust vent 32 of the first temperature control component 3 outputs low-temperature air to the cold air duct of the first air duct mechanical part. Finally, the low-temperature air is output through the cold air exhaust vent D. Simultaneously, a part of the high-temperature air enters the hot air duct of the second air duct mechanical part through the openings C2, and then enters a return air vent 41 of the second temperature control component 4. After the second temperature control component 4 cools this part of high-temperature air, an exhaust vent 42 of the second temperature control component 4 outputs low-temperature air.

The temperature control cabinet 01 provided in this embodiment of this application uses the air duct mechanical part 5, and an air duct group in the air duct mechanical part 5 is separately connected to the first temperature control component 3 and the second temperature control component 4, so that the air entering the air return vent 31 of the first temperature control component 3 and the air entering the air return vent 41 of the second temperature control component 4 are both high-temperature air, and an air duct short circuit influence between a plurality of temperature control components can be eliminated. In addition, return air temperatures of the temperature control components are more uniform, to ensure that the temperature control components can operate with high efficiency, and a temperature control capability of the temperature control cabinet 01 can be improved. Moreover, since the temperature control components operate in a same return air temperature range, useful lives of the temperature control components can be prolonged.

Figure 27:
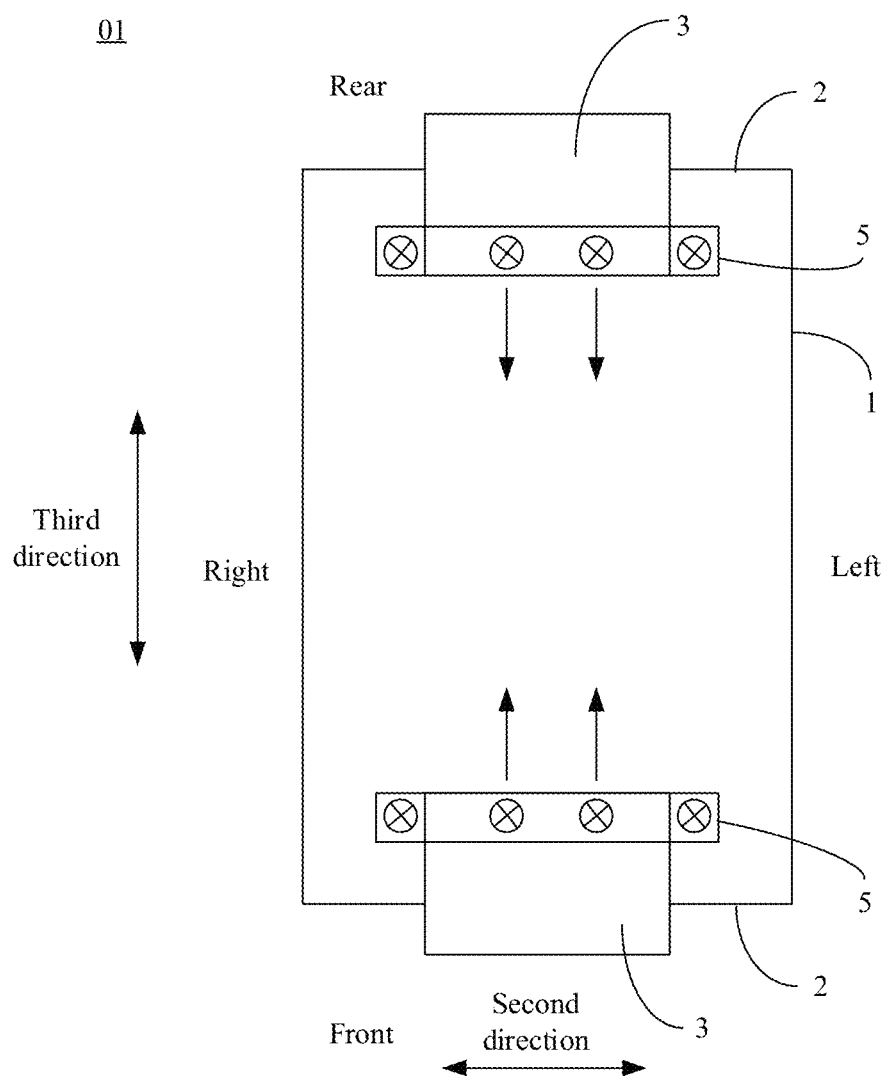
FIG. 27 is a top view of the temperature control cabinet according to Embodiment of this application.

FIG. 27 is a top view of the temperature control cabinet 01 according to this embodiment of this application. An air exhaust direction of the cold air exhaust vent of the first air duct mechanical part is perpendicular to the second direction. In addition, an air exhaust direction of the cold air exhaust vent of the second air duct mechanical part is also perpendicular to the second direction. In Embodiment 5, a design of the air duct mechanical part 5 is relatively simple, and the air from the first temperature control component 3 and the second temperature control component 4 can directly blow the device, so that a temperature control capability of a system can be enhanced.

Embodiment 6

Figure 28:
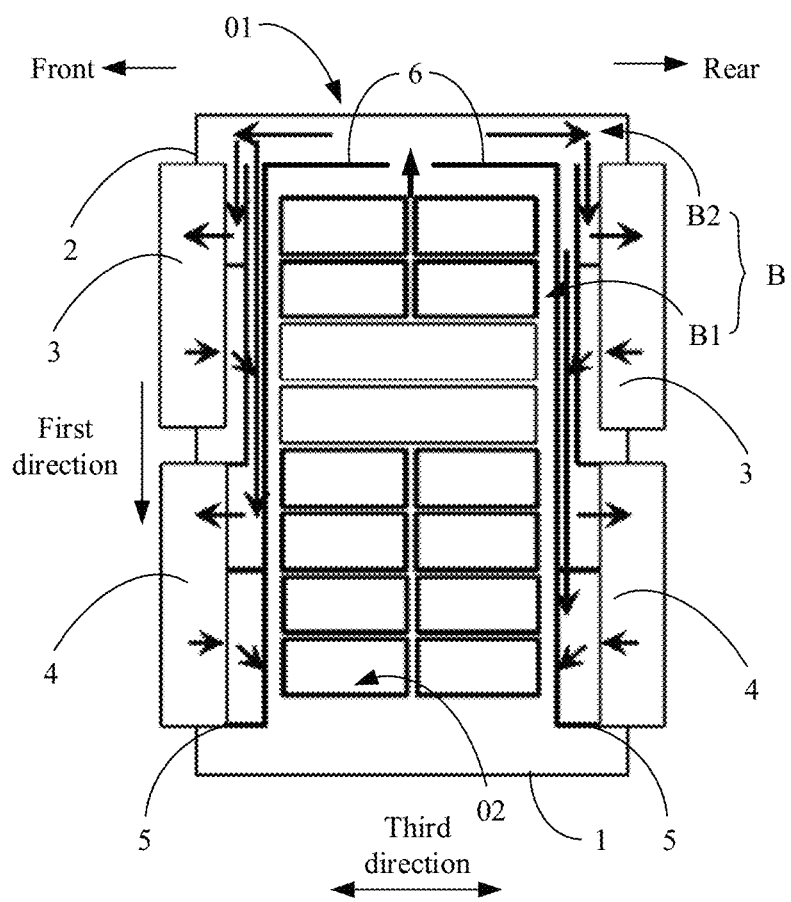
FIG. 28 is another diagram of a structure of the temperature control cabinet and the device viewed in the direction a in FIG. 5.
Figure 29:
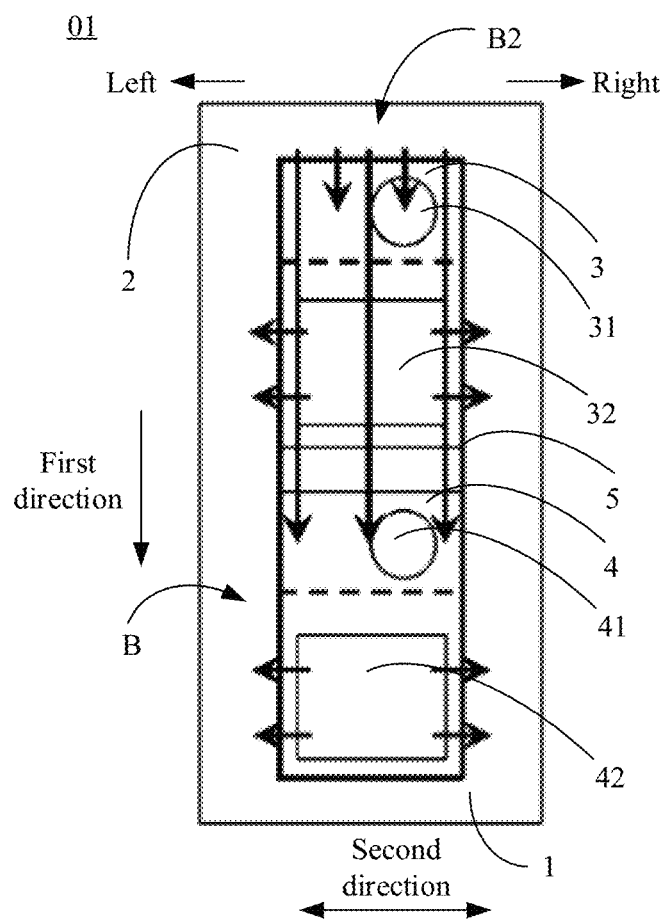
FIG. 29 is another diagram of a structure of the temperature control structure in FIG. 5 viewed in the third direction.
Figure 30:
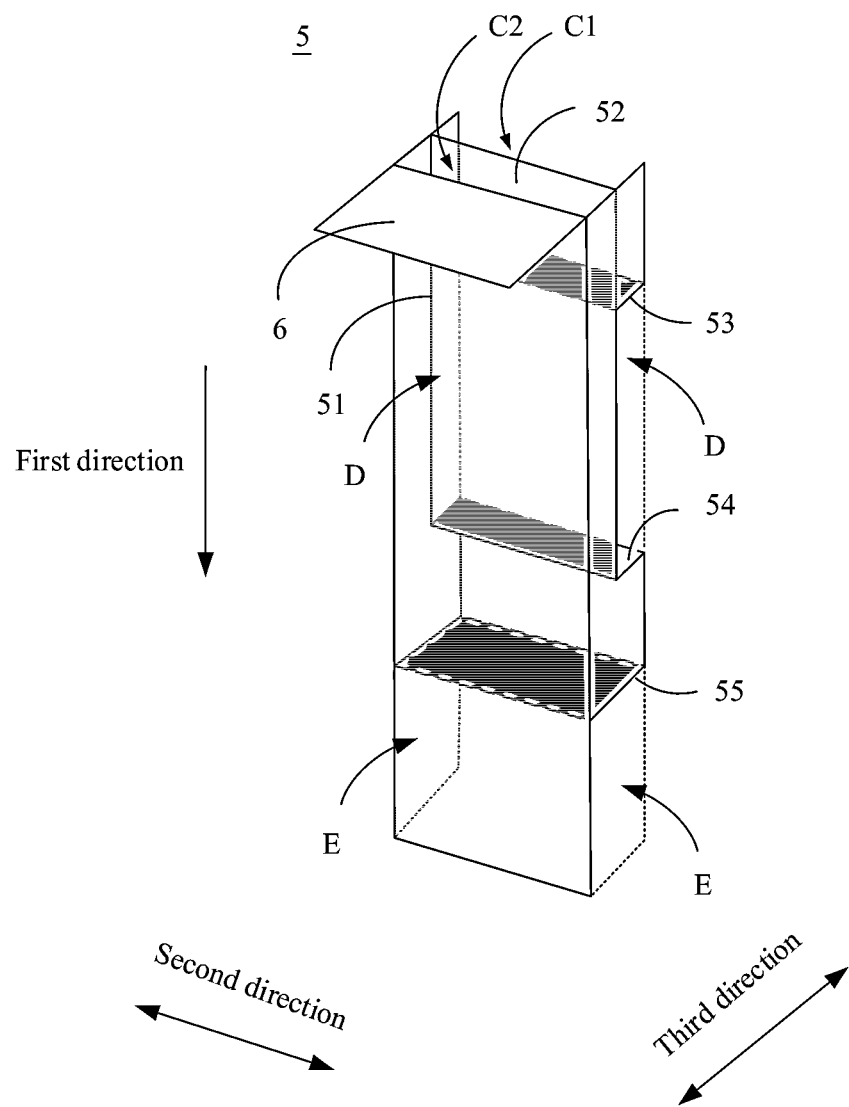
FIG. 30 is a diagram of an exemplary structure of an air duct mechanical part in FIG. 29.
Figure 31:
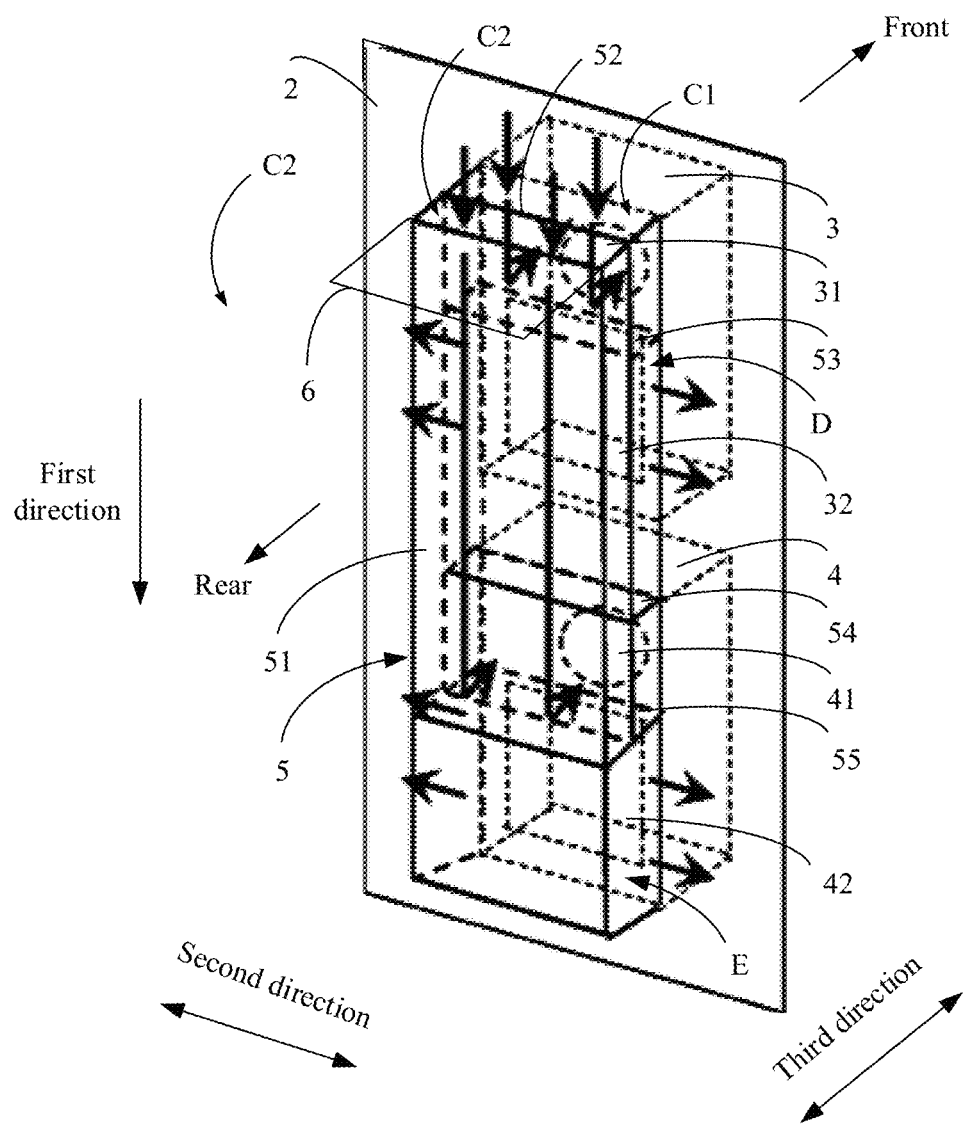
FIG. 31 is a diagram of a stereoscopic structure of the air duct mechanical part in FIG. 30 after being mounted.
Figure 32:
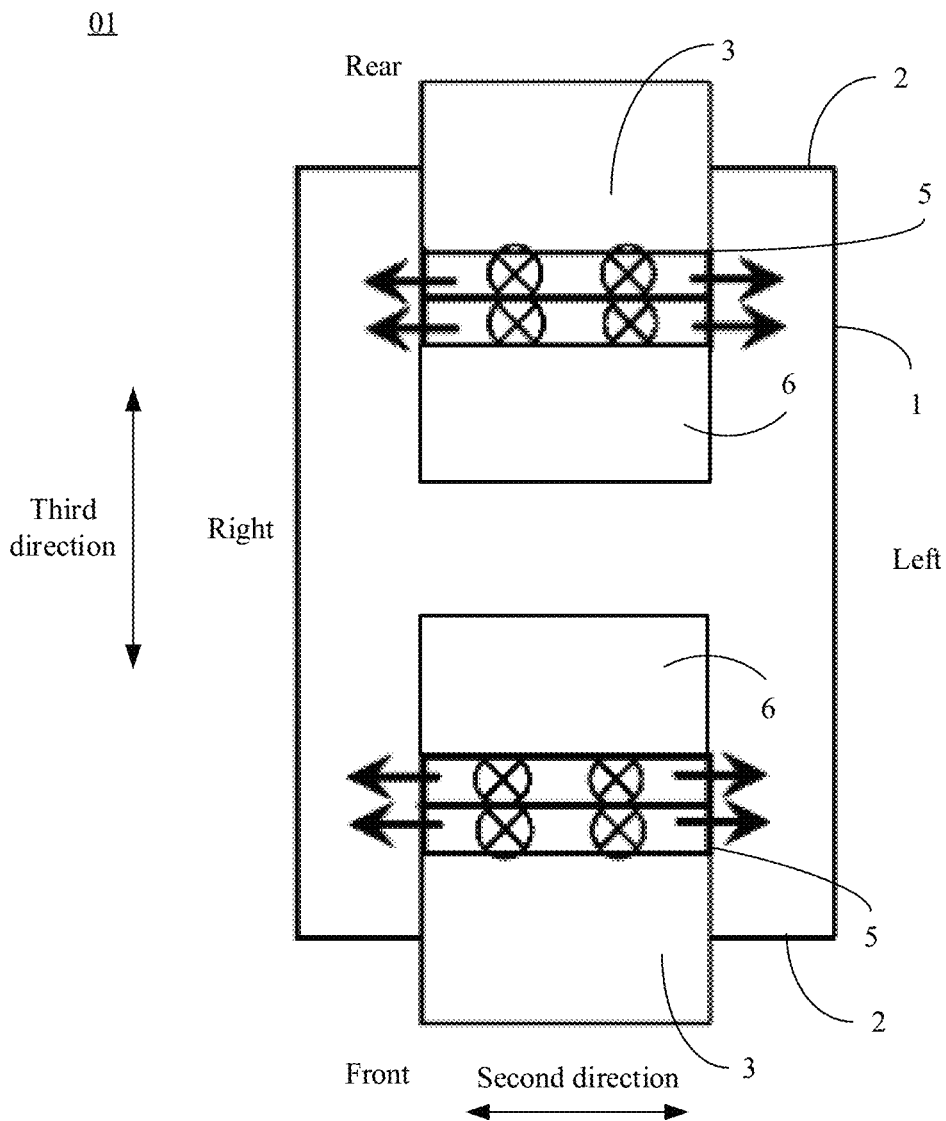
FIG. 32 is a top view of the temperature control cabinet according to Embodiment 6 of this application.

FIG. 28 is another diagram of a structure of the temperature control cabinet 01 and the device 02 viewed in the direction a in FIG. 5; FIG. 29 is a diagram of a structure of the temperature control structure 01 in FIG. 5 viewed in the third direction; FIG. 30 is a diagram of an exemplary structure of the air duct mechanical part 5; FIG. 31 is a diagram of a stereoscopic structure of the air duct mechanical part 5 in FIG. 30 after being mounted; and FIG. 32 is a top view of the temperature control cabinet according to Embodiment 6 of this application.

Embodiment 6 differs from Embodiment 4 only in that the temperature control cabinet 01 provided in Embodiment 6 of this application further includes a cover plate 6. The cover plate 6 is disposed on a side of the air duct mechanical part 5 away from the bottom of a subrack 1 and on a side of the air duct mechanical part 5 away from a first temperature control mechanical part 3. The cover plate 6 has an opening for leading hot air in a device placement area B1 to a hot area B2, so that more high-temperature air can enter the first temperature control component 3 and a second temperature control component 4 from the hot area B2, thereby improving heat dissipation efficiency of an entire system.

Certainly, the cover plate 6 may also be disposed in the temperature control cabinets 01 in Embodiment 1, Embodiment 2, Embodiment 3, and Embodiment 5. The cover plate is not shown in the figure because a structural difference is only the cover plate 6.

Figure 33:
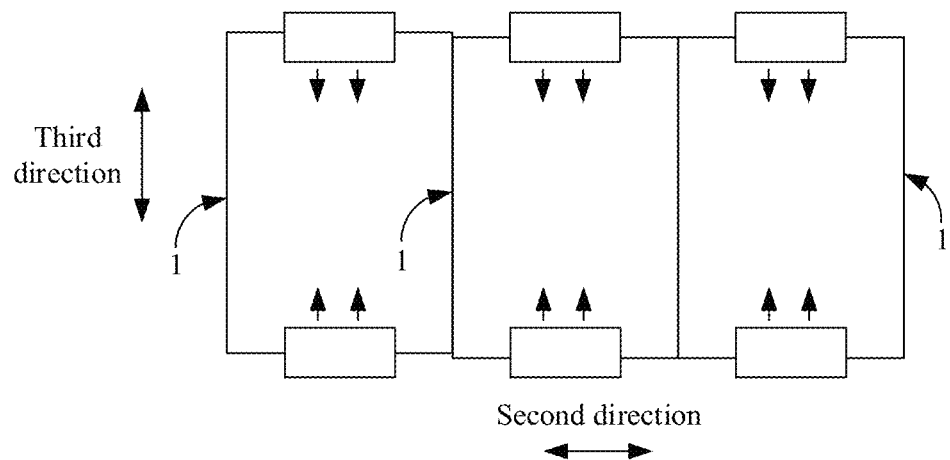
FIG. 33 is a possible application scenario of a temperature control cabinet in the conventional technology.

FIG. 33 shows another combined cabinet application scenario of the temperature control cabinet 01 in the conventional technology, and in this application scenario, a plurality of subracks 1 are arranged in a second direction. Certainly, the temperature control cabinets 01 provided in Embodiment 1, Embodiment 2, Embodiment 3, Embodiment 4, Embodiment 5, and Embodiment 6 of this application may also be applied to the combined cabinet application scenario. An exemplary structure is as follows:

Embodiment 7

Figure 34:
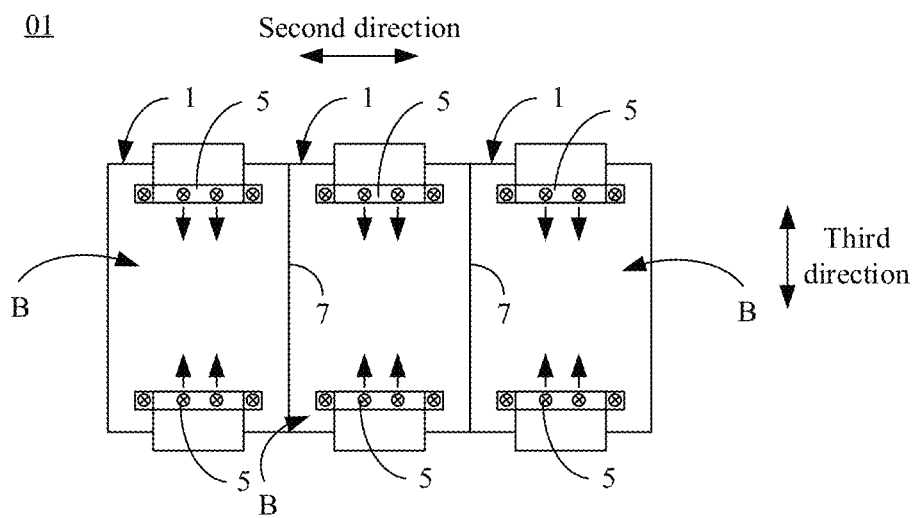
FIG. 34 is a diagram of a structure of a temperature control cabinet according to Embodiment 7 of this application in another application scenario.

In this embodiment, a temperature control cabinet 01 includes a plurality of cabinet units, and when each of the plurality of cabinet units uses the structure shown in Embodiment a structure shown in FIG. 34 is formed. Specifically, subracks 1 of the plurality of cabinet units are arranged in a second direction, two adjacent subracks 1 share a side plate 7 located between the two adjacent subracks, and a placement space B in the subrack 1 of each cabinet unit is independently disposed.

Figure 35:
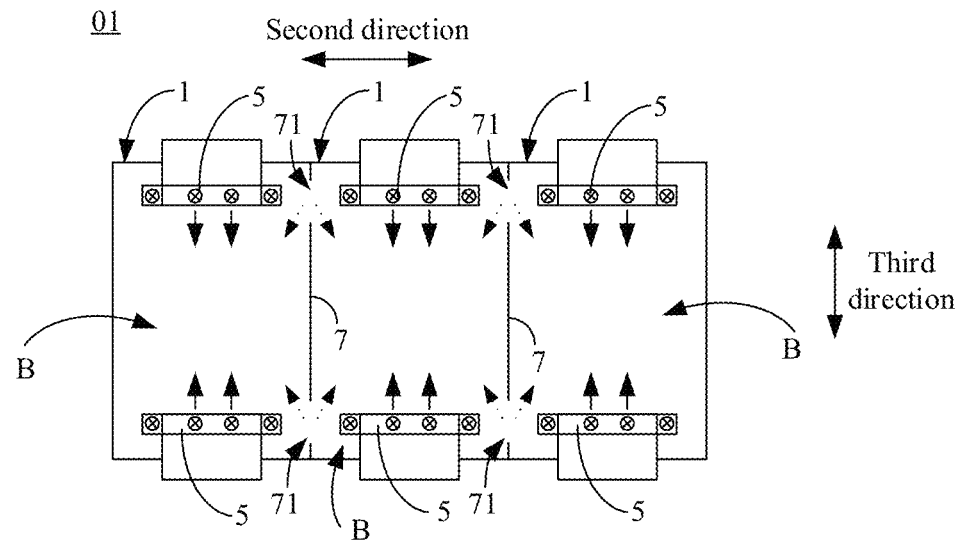
FIG. 35 is another diagram of a structure of the temperature control cabinet according to Embodiment 7 of this application in another application scenario.

Certainly, an opening 71 may be formed in the side plate 7 shared by the adjacent subracks 1 shown in Embodiment 7. Specifically, as shown in FIG. 35, interconnection of the placement spaces B between the cabinets in a combined cabinet scenario is implemented through the openings 71, and since an air leading-out direction of each air duct mechanical part in each cabinet unit is in an arrow direction in the figure, cooling quantities between the cabinets are circulated, and inter-cabinet cooling quantity sharing can be implemented through natural diffusion.

It should be noted that the side plate 7 of each cabinet unit can be provided with an opening 71 structure, and when each cabinet unit is applied to the combined cabinet scenario, a baffle plate structure at the opening 71 is removed.

Figure 36:
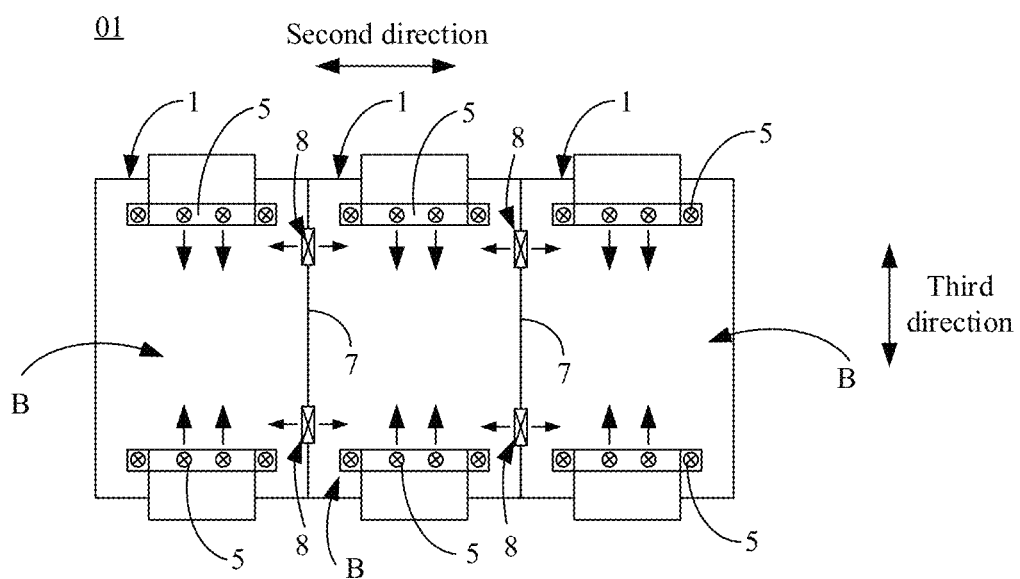
FIG. 36 is another diagram of a structure of the temperature control cabinet according to Embodiment 7 of this application in another application scenario.

In addition, as shown in FIG. 36, an auxiliary circulating device 8 (for example, a fan) may be mounted at the opening 71 of the side plate 7. The fan can form forced convection, so that circulation of the cooling capacities between the cabinets is more effectively formed, and an overall heat dissipation effect is better. Simultaneously, the fan can select a corresponding mounting direction based on different heat consumption distributions in the cabinets, and the fan can also be turned forward or backward, to implement automatic control and switching of air paths through control.

Embodiment 8

Figure 37:
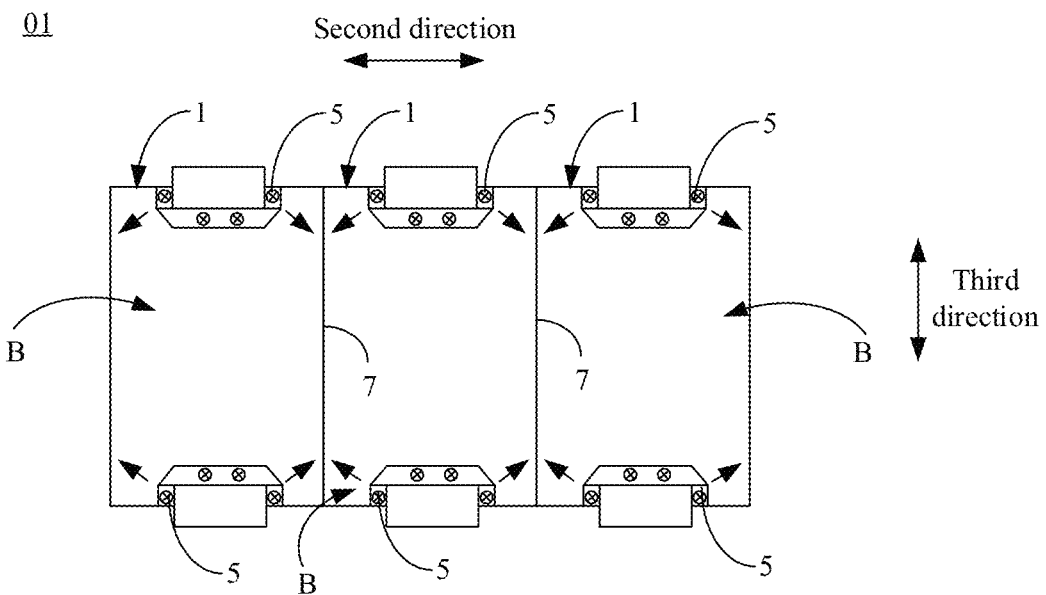
FIG. 37 is a diagram of a structure of a temperature control cabinet according to Embodiment 8 of this application in another application scenario.

FIG. 37 is a diagram of a structure of this embodiment. Refer to a structure shown in FIG. 37. Embodiment 8 differs from Embodiment 7 shown in FIG. 34 only in that each cabinet unit in Embodiment 8 adopts the structure shown in Embodiment 1. Refer to the structure shown in FIG. 37. Subracks 1 of a plurality of cabinet units are arranged in a second direction, two adjacent subracks 1 share a side plate 7 located between the two adjacent subracks, and a placement space B in the subrack 1 of each cabinet unit is independently disposed.

Figure 38:
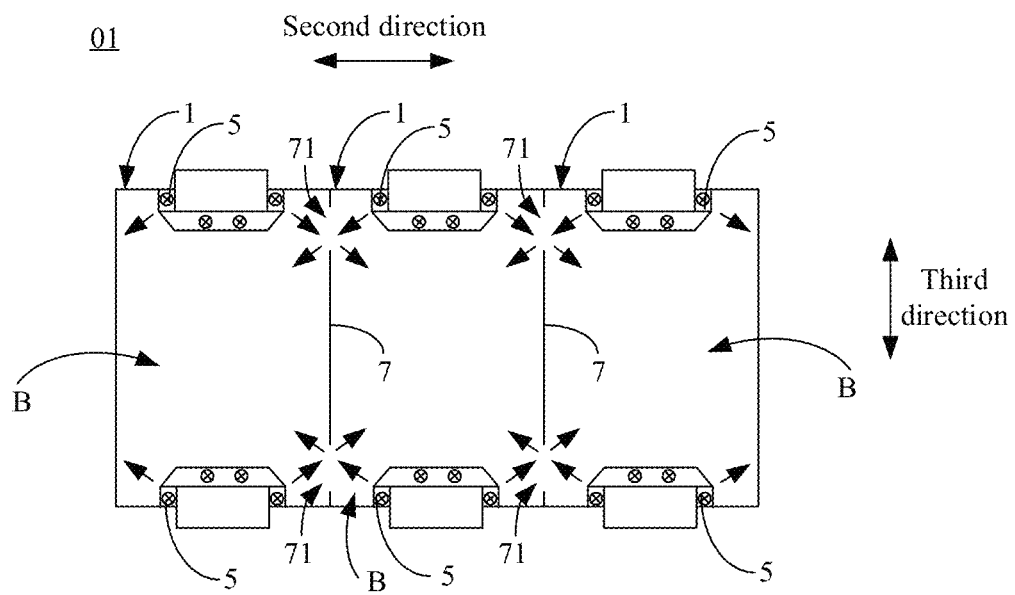
FIG. 38 is another diagram of a structure of the temperature control cabinet according to Embodiment 8 of this application in another application scenario.

Certainly, an opening 71 may be formed in the side plate 7 shared by the adjacent subracks 1 shown in Embodiment 8. Specifically, as shown in FIG. 38, interconnection of the placement spaces B between the cabinets in a combined cabinet scenario is implemented through the openings 71, and since an air leading-out direction in each cabinet unit is in an arrow direction in the figure, cooling quantity circulation between the cabinets is directional air supply implemented through an air duct mechanical part 5, to implement inter-cabinet cooling quantity sharing. In this case, a temperature equalization effect is good.

It should be noted that the side plate 7 of each cabinet unit can be provided with an opening 71 structure, and when each cabinet unit is applied to the combined cabinet scenario, a baffle plate structure at the opening 71 is removed.

In addition, the auxiliary circulating device 8 (for example, a fan) as shown in Embodiment 7 may be mounted at the opening 71 of the side plate 7. Since this structure relates to only a change of the air duct mechanical part compared with the FIG. 36 in Embodiment 7, the auxiliary circulating device is not shown in the figure.

Certainly, the structures in Embodiment 2, Embodiment 3, Embodiment 4, and Embodiment 6 may be selected to form a plurality of cabinet units. As compared with the structures in Embodiment 7 and Embodiment 8, this structure relates to only a difference in the air duct mechanical part 5 in the cabinet unit, details are not described.

Figure 39:
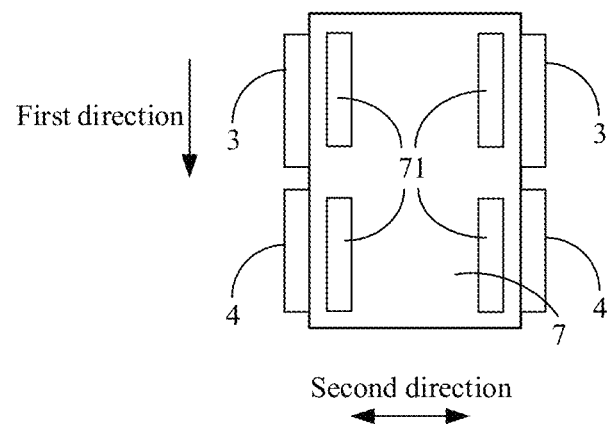
FIG. 39 is a diagram of a structure of a side plate according to an embodiment of this application.
Figure 40:
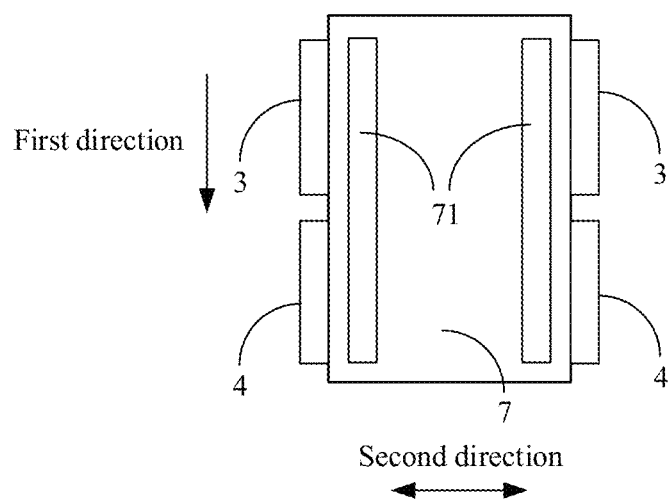
FIG. 40 is another diagram of a structure of a side plate according to an embodiment of this application.
Figure 41:
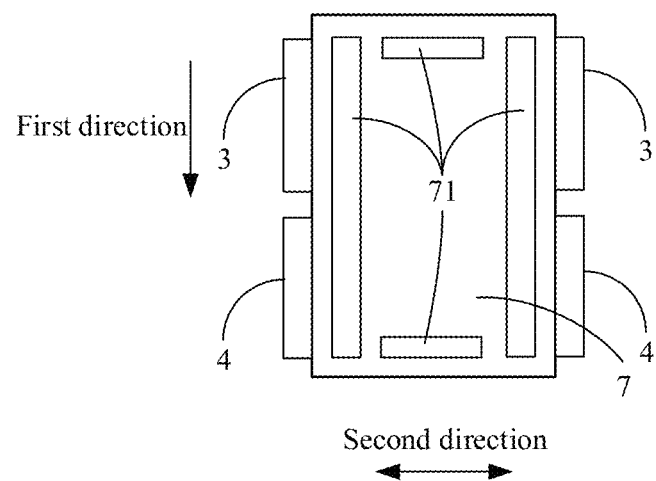
FIG. 41 is another diagram of a structure of a side plate according to an embodiment of this application.
Figure 42:
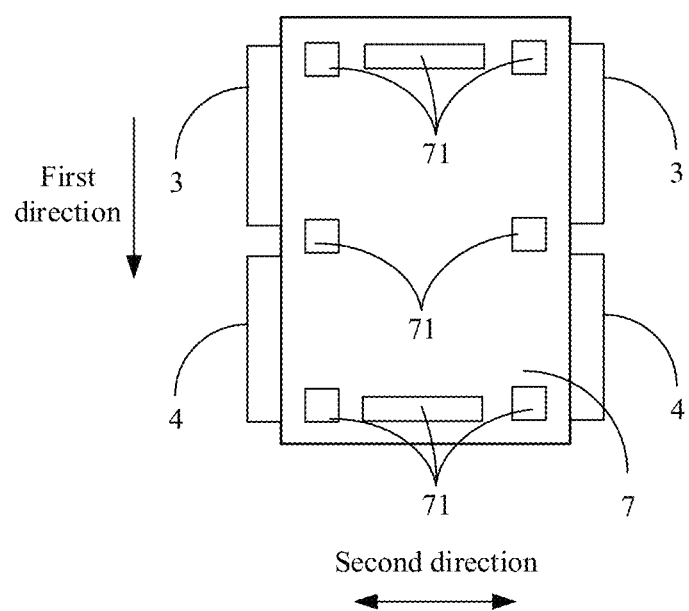
FIG. 42 is another diagram of a structure of a side plate according to an embodiment of this application.

In an exemplary arrangement, the openings 71 in the side plates 7 in Embodiment 7 and Embodiment 8 may be arranged as shown in FIG. 39, or as shown in FIG. 40, FIG. 41, or FIG. 42. It should be understood that different types and quantities of openings 71 in the side plate 7 may be selected, to meet application requirements in different scenarios.

It should be noted that cooling area communication between cabinets can be implemented through the openings 71 shown in FIG. 39 and FIG. 40 due to different arrangement positions of the openings 71, and hot area communication between the cabinets can be implemented through the openings 71 shown in FIG. 41 and FIG. 42.

The foregoing description is merely an exemplary implementation of this application, but is not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A temperature control cabinet, comprising at least one cabinet unit, wherein each cabinet unit comprises:
   a subrack, wherein there is a placement space for placing a device inside the subrack, and there is at least one opening at a periphery of the cabinet; and
   a cabinet door mounted on the subrack and configured to buckle the opening, wherein at least two temperature control components are disposed on the cabinet door, the at least two temperature control components are arranged in a first direction, the first direction is a direction from the top to the bottom of the subrack, each temperature control component is provided with an air exhaust vent and an air return vent, the air return vent of each temperature control component is communicates with a hot area at the top of the placement space, and the air exhaust vent of each temperature control component is communicates with the placement space.

2. The temperature control cabinet according to claim 1, further comprising:
   an air duct mechanical part disposed inside the subrack, wherein the air duct mechanical part is provided with at least one air duct group, the air duct group and the temperature control components are in one-to-one correspondence, and in each pair of the air duct group and the temperature control component that correspond to each other,
   wherein the air duct group is provided with at least one hot air duct and at least one cold air duct, wherein each hot air duct is provided with a hot air intake vent and a hot air exhaust vent, the hot air intake vent is located in the hot area at the top of the placement space, and the hot air exhaust vent is connected to the air return vent of the temperature control component; and each cold air duct is provided with a cold air intake vent and a cold air exhaust vent, the cold air intake vent is connected to the air exhaust vent of the temperature control component, and the cold air exhaust vent is located in the device placement space of the subrack.

3. The temperature control cabinet according to claim 2, wherein a first temperature control component and a second temperature control component are mounted on each cabinet door, the second temperature control component is disposed on a side of the first temperature control component close to a bottom of the subrack, and an air return vent of the first temperature control component, an air exhaust vent of the first temperature control component, an air return vent of the second temperature control component, and an air exhaust vent of the second temperature control component are arranged in sequence in the first direction, and wherein the air duct mechanical part comprises a first air duct mechanical part and a second air duct mechanical part, the first air duct mechanical part is provided with a first air duct group corresponding to the first temperature control component, and the second air duct mechanical part is provided with a second air duct group corresponding to the second temperature control component.

4. The temperature control cabinet according to claim 3, wherein the first air duct mechanical part and the second air duct mechanical part have integrated structures; or the first air duct mechanical part and the second air duct mechanical part have split structures.

5. The temperature control cabinet according to claim 3, wherein a hot air duct of the second air duct mechanical part is located on both sides of the first temperature control component in a second direction, the second direction is perpendicular to the first direction, and the second direction is parallel to the cabinet door; an air exhaust direction of a cold air exhaust vent of the first air duct mechanical part has a first included angle with the second direction, and an angle range of the first included angle is greater than or equal to 0° and less than 90°; and an air exhaust direction of a cold air exhaust vent of the second air duct mechanical part has a second included angle with the second direction, and an angle range of the second included angle is greater than or equal to 0° and less than 90°.

6. The temperature control cabinet according to claim 4, wherein a hot air duct of the second air duct mechanical part is located on both sides of the first temperature control component in a second direction, the second direction is perpendicular to the first direction, and the second direction is parallel to the cabinet door; an air exhaust direction of a cold air exhaust vent of the first air duct mechanical part has a first included angle with the second direction, and an angle range of the first included angle is greater than or equal to 0° and less than 90°; and an air exhaust direction of a cold air exhaust vent of the second air duct mechanical part has a second included angle with the second direction, and an angle range of the second included angle is greater than or equal to 0° and less than 90°.

7. The temperature control cabinet according to claim 5, wherein the second air duct mechanical part is further provided with at least one auxiliary air duct, each auxiliary air duct is provided with an auxiliary intake vent and an auxiliary exhaust vent, the auxiliary intake vent is located at the bottom of the placement space, and the auxiliary exhaust vent communicates with the air return vent of the second temperature control component.

8. The temperature control cabinet according to claim 3, wherein a hot air intake vent of the first air duct mechanical part and a hot air intake vent of the second air duct mechanical part are arranged in a third direction, the third direction is perpendicular to the first direction and a second direction, the second direction is perpendicular to the first direction, and the second direction is parallel to the cabinet door; the hot air intake vent of the first air duct mechanical part is located on a side of the hot air intake vent of the second air duct mechanical part facing the cabinet door; an air exhaust direction of a cold air exhaust vent of the first air duct mechanical part has a first included angle with the second direction, and the first included angle is 0°; and an air exhaust direction of a cold air exhaust vent of the second air duct mechanical part has a second included angle with the second direction, and the second included angle is 0°.

9. The temperature control cabinet according to claim 4, wherein a hot air intake vent of the first air duct mechanical part and a hot air intake vent of the second air duct mechanical part are arranged in a third direction, the third direction is perpendicular to the first direction and a second direction, the second direction is perpendicular to the first direction, and the second direction is parallel to the cabinet door; the hot air intake vent of the first air duct mechanical part is located on a side of the hot air intake vent of the second air duct mechanical part facing the cabinet door; an air exhaust direction of a cold air exhaust vent of the first air duct mechanical part has a first included angle with the second direction, and the first included angle is 0°; and an air exhaust direction of a cold air exhaust vent of the second air duct mechanical part has a second included angle with the second direction, and the second included angle is 0°.

10. The temperature control cabinet according to claim 3, wherein a hot air intake vent of the first air duct mechanical part and a hot air intake vent of the second air duct mechanical part are arranged in a second direction, the second direction is perpendicular to the first direction, and the second direction is parallel to the cabinet door; the second air duct mechanical part is provided with two hot air intake vents, and the hot air intake vent of the first air duct mechanical part is located between the two hot air intake vents of the second air duct mechanical part in the second direction; an air exhaust direction of a cold air exhaust vent of the first air duct mechanical part has a first included angle with the second direction, and the first included angle is 90°; and an air exhaust direction of a cold air exhaust vent of the second air duct mechanical part has a second included angle with the second direction, and the second included angle is 90°.

11. The temperature control cabinet according to claim 4, wherein a hot air intake vent of the first air duct mechanical part and a hot air intake vent of the second air duct mechanical part are arranged in a second direction, the second direction is perpendicular to the first direction, and the second direction is parallel to the cabinet door; the second air duct mechanical part is provided with two hot air intake vents, and the hot air intake vent of the first air duct mechanical part is located between the two hot air intake vents of the second air duct mechanical part in the second direction; an air exhaust direction of a cold air exhaust vent of the first air duct mechanical part has a first included angle with the second direction, and the first included angle is 90°; and an air exhaust direction of a cold air exhaust vent of the second air duct mechanical part has a second included angle with the second direction, and the second included angle is 90°.

12. The temperature control cabinet according to claim 2, wherein the placement space comprises a device placement area for placing a device and the hot area at the top of the device placement area; each cabinet unit further comprises a cover plate for separating the device placement area and the hot area at the top of the device placement area, the cover plate is disposed on a side of the air duct mechanical part away from the bottom of the subrack and on a side of the air duct mechanical part away from the temperature control components; and the cover plate has an opening for leading hot air in the device placement area to the hot area at the top of the device placement area.

13. The temperature control cabinet according to claim 2, wherein each cabinet unit further comprises a window disposed in the hot air duct, and the window is detachably connected to the hot air duct.

14. The temperature control cabinet according to claim 1, comprising at least two cabinet units, wherein adjacent cabinet units in the at least two cabinet units share a side plate disposed between adjacent subracks; and the side plate has a hole for communicating a placement space of a device between the adjacent cabinet units.

15. The temperature control cabinet according to claim 14, wherein an auxiliary circulating device is mounted at the hole, and the auxiliary circulating device is configured to control an air flow status between the adjacent cabinet units.

16. The temperature control cabinet according to claim 15, wherein the auxiliary circulating device is a fan.

17. A communications system, comprising:
a temperature control cabinet; and
a device, wherein the device is disposed in the placement space in the temperature control cabinet;
the temperature control cabinet, comprising at least one cabinet unit, wherein each cabinet unit comprises:
a subrack, wherein there is the placement space for placing the device inside the subrack, and there is at least one opening at a periphery of the cabinet; and
a cabinet door mounted on the subrack and configured to buckle the opening, wherein at least two temperature control components are disposed on the cabinet door, the at least two temperature control components are arranged in a first direction, the first direction is a direction from the top to the bottom of the subrack, each temperature control component is provided with an air exhaust vent and an air return vent, the air return vent of each temperature control component is communicates with a hot area at the top of the placement space, and the air exhaust vent of each temperature control component communicates with the placement space.

18. The communications system according to claim 17, further comprising:
an air duct mechanical part disposed inside the subrack, wherein the air duct mechanical part is provided with at least one air duct group, the air duct group and the temperature control components are in one-to-one correspondence, and in each pair of the air duct group and the temperature control component that correspond to each other,
wherein the air duct group is provided with at least one hot air duct and at least one cold air duct, wherein each hot air duct is provided with a hot air intake vent and a hot air exhaust vent, the hot air intake vent is located in the hot area at the top of the placement space, and the hot air exhaust vent is connected to the air return vent of the temperature control component; and each cold air duct is provided with a cold air intake vent and a cold air exhaust vent, the cold air intake vent is connected to the air exhaust vent of the temperature control component, and the cold air exhaust vent is located in the device placement space of the subrack.

19. The communications system according to claim 18, wherein a first temperature control component and a second temperature control component are mounted on each cabinet door, the second temperature control component is disposed on a side of the first temperature control component close to a bottom of the subrack, and an air return vent of the first temperature control component, an air exhaust vent of the first temperature control component, an air return vent of the second temperature control component, and an air exhaust vent of the second temperature control component are arranged in sequence in the first direction, and
wherein the air duct mechanical part comprises a first air duct mechanical part and a second air duct mechanical part, the first air duct mechanical part is provided with a first air duct group corresponding to the first temperature control component, and the second air duct mechanical part is provided with a second air duct group corresponding to the second temperature control component.

20. The communications system according to claim 19, wherein the first air duct mechanical part and the second air duct mechanical part have integrated structures; or the first air duct mechanical part and the second air duct mechanical part have split structures.

* * * * *

UNITED STATES PATENT AND TRADEMARK OFFICE
CERTIFICATE OF CORRECTION

| | |
|---|---|
| PATENT NO. | : 11,877,426 B2 |
| APPLICATION NO. | : 17/576399 |
| DATED | : January 16, 2024 |
| INVENTOR(S) | : Lian et al. |

It is certified that error appears in the above-identified patent and that said Letters Patent is hereby corrected as shown below:

In the Claims

Claim 1: Column 22, Line 48: "vent of each temperature control component is com-" should read -- vent of each temperature control component com- --.

Claim 1: Column 22, Line 51: "control component is communicates with the place-" should read -- control component communicates with the place- --.

Claim 17: Column 25, Line 47: "vent of each temperature control component is com-" should read -- vent of each temperature control component com- --.

Signed and Sealed this
Thirtieth Day of April, 2024

Katherine Kelly Vidal
*Director of the United States Patent and Trademark Office*